United States Patent
Fukutome et al.

(10) Patent No.: US 9,093,529 B2
(45) Date of Patent: Jul. 28, 2015

(54) SEMICONDUCTOR DEVICE, METHOD OF MANUFACTURING THE SAME, AND METHOD OF EVALUATING SEMICONDUCTOR DEVICE

(75) Inventors: Hidenobu Fukutome, Kawasaki (JP); Tomohiro Kubo, Kawasaki (JP)

(73) Assignee: FUJITSU SEMICONDUCTOR LIMITED, Yokohama, Kanagawa (JP)

( * ) Notice: Subject to any disclaimer, the term of this patent is extended or adjusted under 35 U.S.C. 154(b) by 493 days.

(21) Appl. No.: 12/003,100

(22) Filed: Dec. 20, 2007

(65) Prior Publication Data

US 2008/0142839 A1    Jun. 19, 2008

Related U.S. Application Data

(62) Division of application No. 11/009,011, filed on Dec. 13, 2004, now abandoned.

(30) Foreign Application Priority Data

Jun. 24, 2004    (JP) ................................. 2004-187053

(51) Int. Cl.
*H01L 29/04*     (2006.01)
*H01L 29/78*     (2006.01)
*H01L 21/762*    (2006.01)
*H01L 29/66*     (2006.01)
*H01L 21/265*    (2006.01)
*H01L 21/306*    (2006.01)

(52) U.S. Cl.
CPC ...... *H01L 29/7848* (2013.01); *H01L 21/76264* (2013.01); *H01L 29/045* (2013.01); *H01L 29/66636* (2013.01); *H01L 21/26513* (2013.01); *H01L 21/30608* (2013.01)

(58) Field of Classification Search
CPC .................. H01L 29/66636; H01L 29/7848
USPC ....... 438/300, 607; 257/18, 19, 627, E29.121
See application file for complete search history.

(56) References Cited

U.S. PATENT DOCUMENTS

| 5,323,053 | A | * | 6/1994 | Luryi et al. ............ 257/485 |
| 5,466,616 | A | | 11/1995 | Yang |
| 6,599,789 | B1 | | 7/2003 | Abbott et al. |

(Continued)

FOREIGN PATENT DOCUMENTS

| JP | 58-35938 A | 3/1983 |
| JP | 60-193379 A | 10/1985 |

(Continued)

OTHER PUBLICATIONS

T. Ghani et al. "A 90nm High Volume Manufacturing Logic Technology . . . " IEDM Tech. Dig., (2003).

(Continued)

*Primary Examiner* — David Vu
(74) *Attorney, Agent, or Firm* — Westerman, Hattori, Daniels & Adrian, LLP

(57) ABSTRACT

A semiconductor device has: a silicon (semiconductor) substrate; a gate insulating film and a gate electrode, which are formed on the silicon substrate in this order; and source/drain material layers formed in recesses (holes) in the silicon substrate, the recesses being located beside the gate electrode. Here, each of side surfaces of the recesses, which are closer to the gate electrode, is constituted of at least one crystal plane of the silicon substrate.

19 Claims, 27 Drawing Sheets

(56) References Cited

U.S. PATENT DOCUMENTS

| | | |
|---|---|---|
| 6,921,913 B2 | 7/2005 | Yeo et al. |
| 6,946,350 B2 * | 9/2005 | Lindert et al. ............... 438/285 |
| 6,949,482 B2 | 9/2005 | Murthy et al. |
| 7,045,407 B2 | 5/2006 | Keating et al. |
| 7,545,001 B2 * | 6/2009 | Cheng et al. .................. 257/357 |
| 2003/0098479 A1 | 5/2003 | Murthy et al. |
| 2005/0148147 A1 * | 7/2005 | Keating et al. ............... 438/299 |

FOREIGN PATENT DOCUMENTS

| | | | |
|---|---|---|---|
| JP | 63-153863 A | 6/1988 | |
| JP | 4-180633 A | 6/1992 | |
| JP | 7-50293 A | 2/1995 | |
| JP | 10-511506 A | 11/1998 | |
| WO | 96/20499 A1 | 7/1996 | |
| WO | WO 98/40909 A2 | 9/1998 | |
| WO | 2004/015782 A1 | 2/2004 | |

OTHER PUBLICATIONS

Japanese Office Action dated Mar. 5, 2013, issued in corresponding Japanese Patent Application No. 2011-092086, w/ English translation.

Japanese Office Action dated Feb. 22, 2011, issued in corresponding Japanese Patent Application No. 2004-187053.

US Notice of Allowance dated Apr. 29, 2011, issued in corresponding U.S. Appl. No. 12/859,372 (14 pages).

* cited by examiner

SEMICONDUCTOR DEVICE, METHOD OF MANUFACTURING THE SAME, AND METHOD OF EVALUATING SEMICONDUCTOR DEVICE

CROSS-REFERENCE TO RELATED APPLICATIONS

This application is a divisional of Ser. No. 11/009,011, filed Dec. 13, 2004, which is based upon and claims the benefit of priority from the prior Japanese Patent Application No. 2004-187053, filed on Jun. 24, 2004, the entire contents of which are incorporated herein by reference.

BACKGROUND OF THE INVENTION

1. Field of the Invention

The present invention relates to a semiconductor device, a method of manufacturing the same, and a method of evaluating a semiconductor device.

2. Description of the Related Art

In recent years, semiconductor devices including LSIs and the like have been miniaturized. However, the improvement of the performance of MOS transistors by miniaturization is approaching a limit. Attempts to improve the performance in a generally used MOS transistor by modifying the structure thereof are being made. As one of such attempts, there is a method in which the mobility of carriers is improved by applying appropriate stress to a channel region of the MOS transistor. There are various ways to apply the stress. In Non-Patent Document 1, recesses are formed in a silicon substrate on both sides of a gate electrode, and SiGe layers to be used as source/drain electrodes are epitaxially grown in the recesses, thus introducing strain into a channel by utilizing a difference in lattice constant between silicon and SiGe. According to Non-Patent Document 1, this structure is said to have the significant effect in that the drive current of a p-type MOS transistor is improved by 10% or more.

Moreover, in addition to Non-Patent Document 1, technologies related to the present invention are also disclosed in Patent Documents 1 to 4.

(Patent Document 1) Japanese Unexamined Patent Publication No. Sho 58 (1983)-35938

(Patent Document 2) Japanese Unexamined Patent Publication No. Hei 4 (1992)-180633

(Patent Document 3) Japanese Unexamined Patent Publication No. Hei 7 (1995)-50293

(Patent Document 4) WO98/40909 International Publication Pamphlet (Non-Patent Document 1) T. Ghani et al., "A 90 nm High Volume Manufacturing Logic Technology Featuring Novel 45 nm Gate Length Strained Silicon CMOS Transistors," IEDM Tech Dig., pp. 978-980, (2003)

Incidentally, in the structure disclosed in Non-Patent Document 1, stress is applied to the channel from the SiGe layers as described previously. If the amount of the stress is nonuniform in the gate width direction or varies among transistors, this transistor cannot be produced in volume to be widely used.

Moreover, not only in the MOS transistor disclosed in Non-Patent Document 1, but also in a general MOS transistor in which recesses for SiGe layers are not formed in a silicon substrate, when a new device or the like is developed, a test MOS transistor is fabricated, and characteristics thereof are evaluated. Among a number of characteristics, a carrier distribution in a channel greatly influences the performance of a transistor. Accordingly, it is preferable that the carrier distribution is directly measured. However, a method of measuring the carrier distribution has not been established so far.

SUMMARY OF THE INVENTION

According to an aspect of the present invention, there is provided a semiconductor device including: a semiconductor substrate; a gate insulating film and a gate electrode which are formed on the semiconductor substrate in this order; and a source/drain material layer formed in a hole in the semiconductor substrate, the hole being located beside the gate electrode. Here, a side surface of the hole which is closer to the gate electrode includes at least one crystal plane of the semiconductor substrate.

In the above-described semiconductor device, the side surface of the hole in which the source/drain material layer is formed is constituted of a crystal plane of the semiconductor substrate. Accordingly, as compared to Patent Document 1 in which a side surface of a hole is constituted of not a crystal plane but a curved surface, stress is stably applied to a channel under the gate electrode, and variation in characteristics of MOS transistors among elements is suppressed.

Such a side surface of the hole may be constituted of two crystal planes of the semiconductor substrate, and a cross-sectional shape of the side surface may be concave. Such a cross-sectional shape makes characteristics of the interface between the semiconductor substrate and the gate insulating layer less prone to deterioration due to the stress because the stress has a peak at a position deeper than the surface of the semiconductor substrate, and can also make the reliability of the MOS transistor favorable while improving the drive capability thereof.

Alternatively, the following may be adopted: the side surface of the hole is constituted of two crystal planes of the semiconductor substrate, and a cross-sectional shape of the side surface is made convex. In the source/drain material layer formed in the hole having such a cross-sectional shape, large stress is generated in directions from the upper and lower surfaces of the source/drain material layer toward the channel, whereas stress becomes weak in the vicinity of the top of the convex. Thus, stress favorable for the improvement in the performance of a MOS transistor can be obtained.

Furthermore, instead of such a concave or convex side surface, the side surface of the hole may be constituted of a single crystal plane perpendicular to the semiconductor substrate. This allows uniform stress having a small strength variation in the depth direction to be stably applied to the channel from the source/drain material layer in the hole.

Moreover, according to another aspect of the present invention, there is provided a method of manufacturing a semiconductor device, which includes the steps of: forming a gate insulating film on a semiconductor substrate; forming a gate electrode on the gate insulating film; forming a sidewall on a side surface of the gate electrode; forming a hole in the semiconductor substrate beside the gate electrode using an organic alkaline solution or a tetramethylammonium hydroxide (TMAH) solution as an etchant, after forming the sidewall; and forming a source/drain material layer in the hole.

In this method of manufacturing a semiconductor device, since the hole is formed in the semiconductor substrate using an organic alkaline solution or a TMAH solution, a crystal plane of the semiconductor substrate appears at the etched surface, and a side surface of the hole is constituted of the crystal plane. Accordingly, the excellent reproducibility of the shape of the hole comes to be shown as compared to the case where the side surface of the hole is constituted of a curved surface as in Patent Document 1. Even in the case where MOS transistors are integrally formed in the semiconductor substrate, stress is applied to the channel from the source/drain material layer formed in the hole, without variation among elements.

Further, when the hole is formed, the thickness of the gate electrode may be reduced by etching. In that case, a refractory metal layer is formed on the thinned gate electrode, and the refractory metal layer is heated to undergo reaction with the gate electrode, whereby the entire gate electrode is silicided. Such a gate electrode is called a metal gate. The above-described technique allows compatibility between a formation process of the metal gate and that of the hole.

Note that, in the case where the gate electrode does not need to be etched as described above, p-type impurities having the effect of delaying etching in a TMAH solution or an organic alkaline solution can be introduced into the gate electrode in advance.

Furthermore, the following may be adopted: a first conductivity type impurity diffusion region and a second conductivity type impurity diffusion region which is deeper than the first conductivity type impurity diffusion region are formed in the silicon substrate, and the hole is formed more deeply than the first conductivity type impurity diffusion region. This causes the etch rate for forming the hole to vary between the first and second conductivity type impurity diffusion regions due to differences in impurity concentration and conductivity type between the impurity diffusion regions. Accordingly, a plurality of crystal planes appear at the side surface of the hole.

For example, in the case where the first conductivity type impurity diffusion region is set to the p-type and the second conductivity type impurity diffusion region is set to the n-type, the side surface of the hole is constituted of two crystal planes, and the cross-sectional shape of the side surface becomes a concave shape which bends at the interface between these two crystal planes as a boundary.

On the other hand, in the case where the first conductivity type impurity diffusion region is set to the p-type and p-type impurities are introduced into the second conductivity type impurity diffusion region at a higher concentration than in the first conductivity type impurity diffusion region, the side surface of the hole is constituted of two crystal planes, and the cross-sectional shape of the side surface becomes a convex shape which bends at the interface between these two crystal planes as a boundary.

Furthermore, an SOI substrate may be used as the semiconductor substrate. In the case where an SOI substrate is used, when the hole is formed by etching in a TMAH solution or an organic alkaline solution, the etch rate becomes low in the vicinity of a buried insulating film partially constituting the SOI substrate, and the etch rate varies depending on the depth in the substrate. Thus, a plurality of crystal planes appear at the side surface of the hole in etching, and these crystal planes constitute the side surface of the hole.

Moreover, in the case where a silicon substrate is used as the semiconductor substrate, the surface orientation of the silicon substrate is set to (110), and the gate width direction is set to the [111] direction, whereby the side surface of the hole is constituted of a (111) plane perpendicular to the surface of the silicon substrate.

On the other hand, in the case where the surface orientation of the silicon substrate is set to (110) similarly to the above and the gate width direction is set to [100] the tilt of a (111) plane which is viewed from the surface of the silicon substrate becomes gentle, and the gentle (111) plane constitutes the side surface of the hole.

Furthermore, according to another aspect of the present invention, there is provided a method of evaluating a semiconductor device, which includes the steps of: removing a gate electrode of a MOS transistor, which is formed in a semiconductor substrate, by selective etching using an organic alkaline solution or a TMAH solution as an etchant; exposing a channel of the MOS transistor by removing a gate insulating film of the MOS transistor by wet etching; and investigating a carrier distribution in the exposed channel using a microscope.

An organic alkaline solution and a TMAH solution provide high etch selectivity between semiconductor, such as silicon, and oxide, such as silicon dioxide. Accordingly, when the gate electrode of the MOS transistor is selectively etched, the thickness of the gate insulating film under the gate electrode is scarcely reduced. As a result, in the above-described method of evaluating a semiconductor device, damage does not easily occur in the channel under the gate insulating film, and the carrier distribution in the channel is not easily disturbed. Accordingly, a carrier distribution in a state similar to that of actual use can be obtained.

DETAILED DESCRIPTION OF THE PREFERRED EMBODIMENTS

Hereinafter, best modes for carrying out the present invention will be described in detail with reference to the accompanying drawings.

(1) First Embodiment

Figure 1:
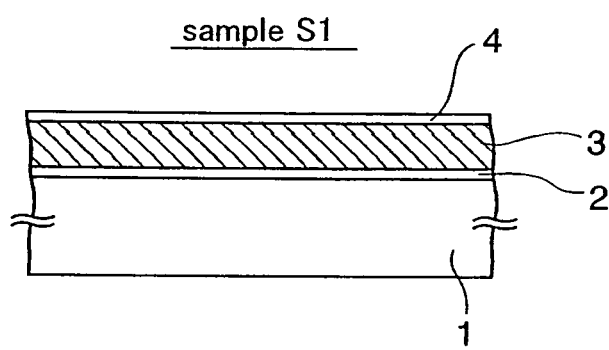
FIG. 1 contains cross-sectional views of samples used for investigating the etch selectivity between silicon and silicon dioxide in a TMAH solution in a first embodiment of the present invention.
Figure 1:
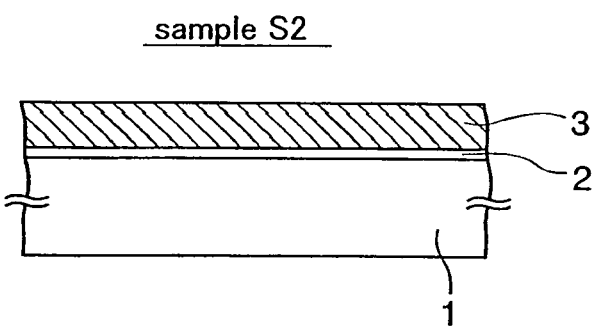

Recesses of a silicon substrate for growing SiGe layers can be formed by generally-used wet etching in which KOH or a mixture of hydrofluoric acid and nitric acid is used as an etchant. However, use of these etchants makes it difficult to control the shapes of the recesses because the side surface of each recess becomes a gently curved surface as shown in FIG. 1 of Patent Document 1. Accordingly, there is variation in the shapes of the side surfaces of the recesses among elements, and characteristics of MOS transistors may therefore vary among the elements.

Moreover, if dry etching is used instead of the above-described wet etching, the surfaces of the recesses are damaged by plasma. Accordingly, lattice defects may be created in the SiGe layers epitaxially grown on the recesses.

In light of these points, the inventor of the present application has searched for an etchant replacing KOH and a mixture of hydrofluoric acid and nitric acid to find out that a tetramethylammonium hydroxide (TMAH) solution can be used as a suitable etchant for forming the recesses. Furthermore, it has been found out that an organic alkaline solution made by mixing an alkaline solution, alcohol, and water is also suitable as the above-described etchant.

Accordingly, hereinafter, experiments which the inventor of the present application performed in order to investigate etching characteristics of the TMAH and the organic alkaline solution will be described.

(a) Etch Selectivity

FIG. 1 contains cross-sectional views of samples used for investigating the etch selectivity between silicon and silicon dioxide in a TMAH solution. Of these samples, sample S1 was prepared as described below.

First, a silicon dioxide layer 2 was formed on a silicon substrate 1 by plasma chemical vapor deposition (CVD) using silane ($SiH_4$), and then a polysilicon layer 3 having a thickness of 100 nm was formed by low-pressure CVD (LPCVD) using silane as reactant gas. Subsequently, the surface of the polysilicon layer 3 was exposed to nitric acid to be oxidized, thereby forming an oxide film 4 having a thickness of approximately 1.0 nm.

On the other hand, sample S2 was made by forming a polysilicon layer 3 in the same way as that for sample S1 and then terminating the surface of the polysilicon layer 3 with hydrogen by exposure to hydrofluoric acid. A layer corresponding to the oxide film 4 of sample S1 was not formed.

Thereafter, a TMAH solution with a volume concentration of 5 to 30% was prepared by dissolving TMAH in pure water, and the above-described samples S1 and S2 were wet-etched using this TMAH solution. Then, after this etching was performed for a predetermined time, the film thickness of the native oxide film 4 of sample S1 and that of the polysilicon layer 3 of sample S2 were measured using a film thickness gauge, and the results of the measurements are compared with the initial film thicknesses of these films, whereby etched amounts were estimated. The results are shown in FIG. 2.

Figure 2:
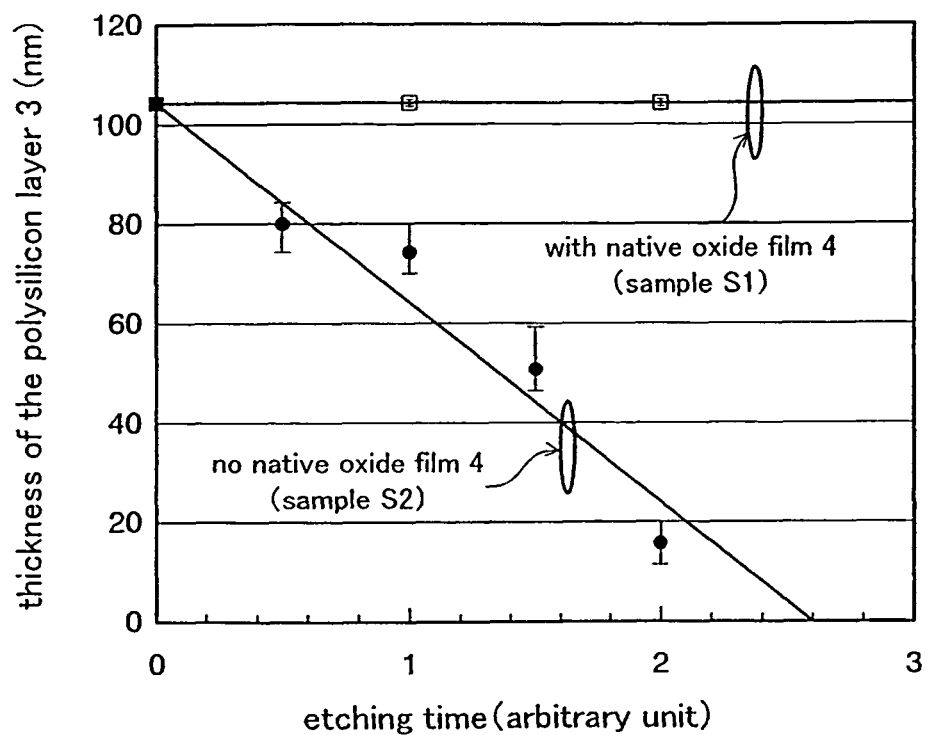
FIG. 2 is a graph obtained by investigating the etch rates of silicon and silicon dioxide in the TMAH solution in the first embodiment of the present invention.

The horizontal axis of FIG. 2 represents etching time in the TMAH solution, and the vertical axis thereof represents the thickness of the polysilicon layer 3 after etching.

As apparent from FIG. 2, etching does not proceed at all in sample S1 in which the native oxide film 4 is formed, whereas, in sample S2 in which the polysilicon layer 3 is exposed, the polysilicon layer 3 is etched as the etching time proceeds.

The above-described results have revealed that the etch rate of silicon dioxide in the TMAH solution can be regarded as 0 nm/min and that, on the other hand, the etch rate of silicon is a finite value. Moreover, the result of other experiment performed by the inventor of the present application has also revealed that the etch rate of silicon in the TMAH solution depends on the temperature of the TMAH solution.

Figure 3:
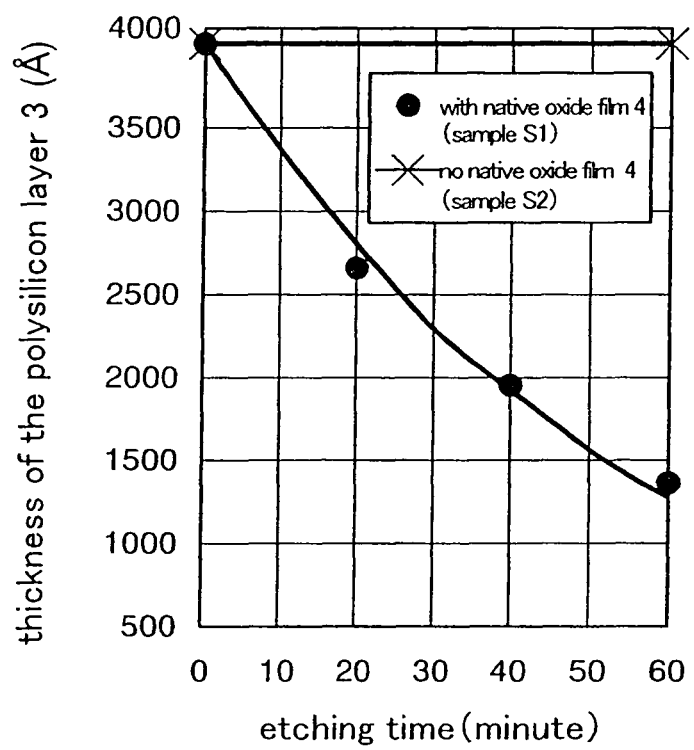
FIG. 3 is a graph obtained by investigating the etch rates of silicon and silicon dioxide in an organic alkaline solution in the first embodiment of the present invention.

FIG. 3 is a graph obtained by performing the same experiment as the above using an organic alkaline solution instead of the TMAH solution. The organic alkaline solution was prepared as follows: an ammonium hydroxide solution with a concentration of 20 wt % or more was prepared by putting ammonium hydroxide in pure water, and then isopropyl alcohol (IPA) was dissolved in this ammonium hydroxide solution with a concentration of 2 wt % or more.

As shown in FIG. 3, it has been revealed that the organic alkaline solution also selectively etches silicon but does not etch silicon dioxide.

Incidentally, an organic alkaline solution is not limited to the above-described one. A mixed solution of an alkaline solution other than an ammonium hydroxide solution and heavy alcohol, such as IPA or the like, may be used as the organic alkaline solution.

(b) Dependence of Etch Rate in TMAH Solution on Impurity Concentration

In the above-described experiments of FIGS. 2 and 3, impurities were not introduced into the polysilicon layer 3. However, it is speculated that the etch rate of the polysilicon layer 3 depends on the concentration of impurities. In order to confirm this point, the inventor of the present application performed the experiment described below.

In this experiment, three samples having the same structure as that of the aforementioned sample S2 were prepared. Then, arsenic ions as n-type impurities and boron ions as p-type impurities are implanted into the polysilicon layers 3 of two of these samples, respectively. The doping amount in the ion implantation was set to $1.0 \times 10^{17}$ cm$^{-3}$ to $2.0 \times 10^{21}$ cm$^{-3}$. Meanwhile, the polysilicon layer 3 of the other sample was left undoped, that is, impurities were not introduced into the polysilicon layer 3 of the other sample.

Thereafter, the polysilicon layers 3 of these samples were exposed to the TMAH solution for a predetermined time, and the etched amounts of the polysilicon layers 3 were investigated. The results are shown in FIG. 4.

Figure 4:
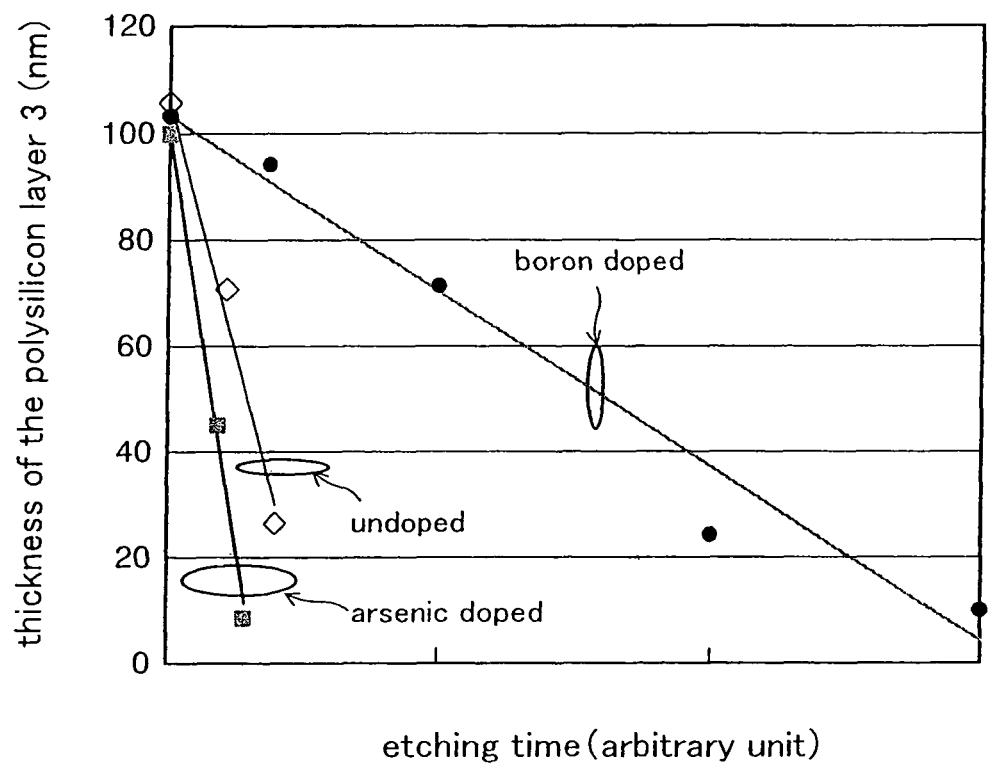
FIG. 4 is a graph obtained by investigating the dependence of the etch rate in the TMAH solution on the concentration of impurities in the first embodiment of the present invention.

As shown in FIG. 4, it has been revealed that, in the case where the n-type impurities (arsenic) have been introduced, the etch rate of the polysilicon layer 3 becomes faster compared to the undoped case. On the other hand, it has been revealed that, in the case where the p-type impurities (boron) are introduced, the etch rate of the polysilicon layer 3 becomes slower compared to the undoped case. Furthermore, other experiment performed by the inventor of the present application has also revealed that, in the case where the doping amount of boron is set to ten times that shown in FIG. 4, the etching of the polysilicon layer 3 hardly proceeds.

(2) Second Embodiment

Next, a method of fabricating a MOS transistor will be described. In this method, recesses are formed in a silicon substrate by utilizing etching characteristics of a TMAH solution or an organic alkaline solution. The etching characteristics have been revealed in the first embodiment, and SiGe layers in the recesses are used as source/drain electrodes.

FIGS. 5A to 5G are cross-sectional views of a semiconductor device according to the present embodiment in the process of manufacture.

Figure 5A:
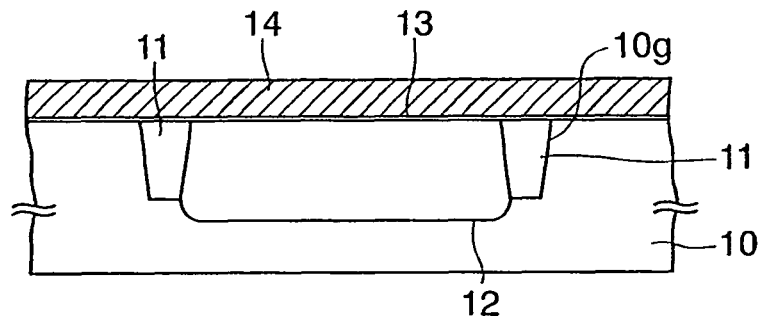
FIGS. 5A to 5G are cross-sectional views showing a method of manufacturing a semiconductor device according to a second embodiment of the present invention, in the process of manufacture.

To begin with, steps to be performed before the cross-sectional structure shown in FIG. 5A is obtained will be described.

First, an element isolation trench 10g for shallow trench isolation (STI) is formed in a p-type silicon (semiconductor) substrate 10 with (001) surface orientation, and then a silicon dioxide layer is buried as an element isolation insulating film 11 in the element isolation trench 10g. Thereafter, ion implantation is performed on the silicon substrate 10 under the following conditions: for example, in the case where phosphorus is used as n-type impurities, the acceleration energy is approximately 300 keV or more, and the dose is $1 \times 10^{13}$ cm$^{-2}$ or more. Thus, an n-well 12 is formed in a p-type MOS transistor formation region delimited by the element isolation insulating film 11.

Incidentally, in the case where a CMOS structure is formed by fabricating an n-type MOS transistor in addition to the p-type MOS transistor, a p-well (not shown) is formed by implanting, for example, boron ions as p-type impurities into an n-type MOS transistor formation region of the silicon substrate 10 under the following conditions: the acceleration energy is 100 keV or more, and the dose is $1 \times 10^{13}$ cm$^{-2}$ or more. In this case, the p-type and n-type impurities are respectively implanted using resist patterns (not shown) on the silicon substrate 10, and each resist pattern is removed in a wet process after ion implantation.

Subsequently, the surface of the silicon substrate 10 is thermally oxidized, thus forming a gate insulating film 13 which is made of silicon dioxide and which has a thickness of approximately 0.5 to 5.0 nm. Here, a gate insulating film in which a very small amount of nitrogen is added to silicon dioxide may be adopted as the gate insulating film 13. Further, a polysilicon layer 14 having a thickness of approximately 10 to 300 nm is formed on the gate insulating film 13 by LPCVD using silane, and then ions of p-type impurities are implanted into the polysilicon layer 14 at a concentration at which the etching of polysilicon in a TMAH solution does not proceed. In the present embodiment, boron is adopted as such p-type impurities, and ion implantation is performed on the polysilicon layer 14 under conditions optimized so that a sufficiently high concentration can be achieved in the entire gate electrode. The conditions are an acceleration energy of approximately 0.5 to 20 keV and a dose of approximately $1 \times 10^{14}$ to $1 \times 10^{17}$ cm$^{-2}$.

Figure 5B:
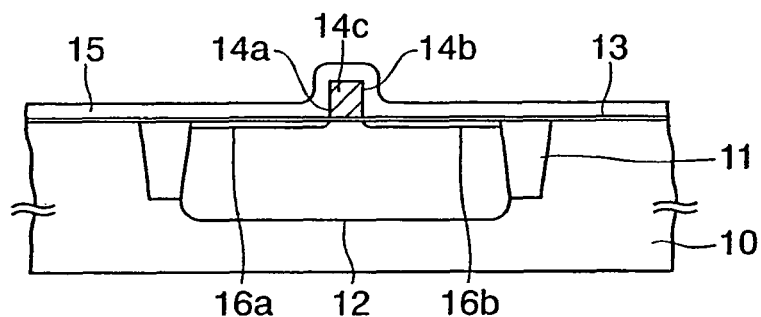

Next, steps to be performed before the cross-sectional structure shown in FIG. 5B is obtained will be described.

First, the polysilicon layer 14 is patterned into a gate electrode 14c by photolithography.

In this example, though description will be made based on a process in which extensions and pockets are formed after gate processing without forming thin spacers, a method can also be adopted in which extension and pocket implantation is performed after thin spacers having thicknesses of 5 to 20 nm have been formed in order to form optimum overlaps between the gate and the extensions. Further, a method can also be adopted in which spacers are formed only for one of the nMOS and the pMOS. Any spacer can be adopted as long as the spacer has the function as a spacer, regardless of the film structure and shape of the spacer.

Subsequently, using the gate electrode 14c as a mask, for example, boron ions as p-type impurities are implanted into the silicon substrate 10 under the following conditions: the acceleration energy is approximately 0.2 to 1.0 keV, the dose is approximately $1 \times 10^{14}$ to $2 \times 10^{15}$ cm$^{-2}$, and the tilt angle is 0 to 15 degrees. Thus, first and second source/drain extensions 16a and 16b are shallowly formed in the silicon substrate 10 beside the first and second side surfaces 14a and 14b of the gate electrode 14c. In the same positions, pocket implantation for suppressing the short channel effect is performed under the following conditions: for example, antimony is used, the acceleration energy is 30 to 80 keV, the dose is $1 \times 10^{13}$ to $2 \times 10^{14}$ cm$^{-2}$, and the tilt angle is 0 to 35 degrees. In the case where BF2 is used as ionic species for the source/drain extension implantation, optimum conditions are provided by setting the energy to 1 to 2.5 keV and doubling the dose. The above-described optimum conditions change with the presence or absence of spacers and the thicknesses thereof. In the case where there are spacers, it is necessary to achieve optimum conditions by setting the energy for the pockets higher and setting the dose for the extensions larger. Further, pocket implantation using arsenic, phosphorus, antimony, or the like can also be adopted, and this pocket implantation may be performed before and after the extension implantation.

Thereafter, a silicon dioxide layer is formed as a first sidewall insulating layer 15 on the entire surface by plasma CVD using silane under conditions where the substrate temperature is approximately 600° C. or less, thus covering the first and second side surfaces 14a and 14b of the gate electrode 14c with the first sidewall insulating layer 15. Note that, instead of the silicon dioxide layer, a silicon nitride layer may be formed as the first sidewall insulating layer 15.

Figure 5C:
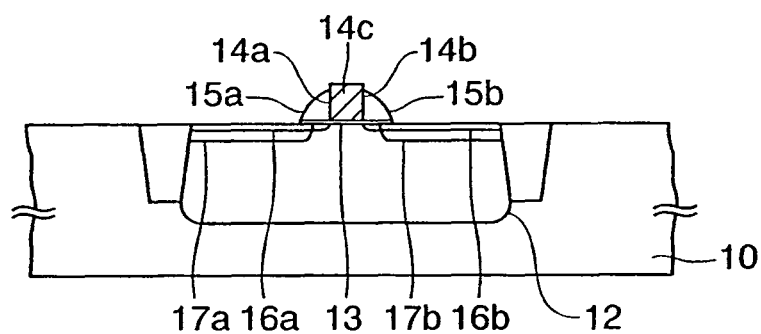

Next, steps to be performed before the cross-sectional structure shown in FIG. 5C is obtained will be described.

First, the first sidewall insulating layer 15 is etched back by plasma etching to leave first sidewalls 15a and 15b on the first and second side surfaces 14a and 14b. Further, in this etching, the portion of the gate insulating film 13 which is not covered with the first sidewalls 15a and 15b is also etched, whereby the gate insulating film 13 is left only under the gate electrode 14c.

Furthermore, using the gate electrode 14c and the first sidewalls 15a and 15b as a mask, for example, boron ions are implanted as p-type impurities (impurities of a first conductivity type) into the silicon substrate 10. Thus, source/drain regions 17a and 17b which are deeper and denser than the source/drain extensions 16a and 16b are formed in the silicon substrate 10 beside the gate electrode 14c.

Thereafter, the impurities in the source/drain regions 17a and 17b are activated by performing activation anneal under the following conditions: for example, the substrate temperature is approximately 950 to 1050° C. This heat treatment may be omitted as needed.

Figure 5D:
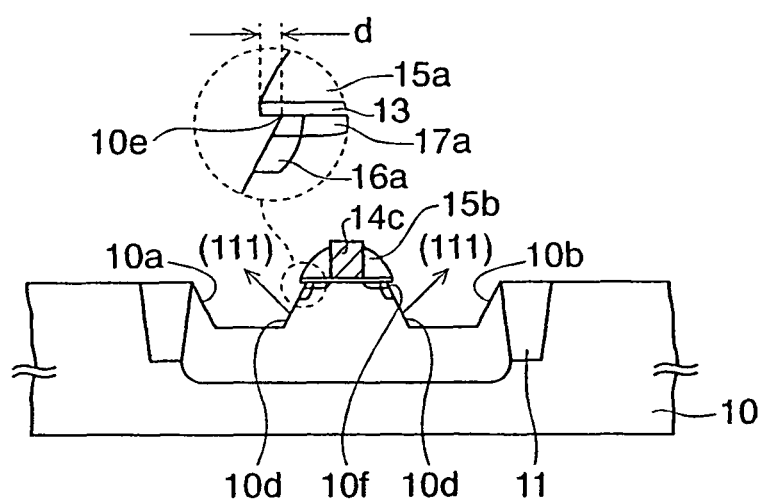

Next, steps to be performed before the cross-sectional sectional structure shown in FIG. 5D is obtained will be described.

First, the silicon substrate 10 is immersed in a TMAH solution having a volume concentration of 5 to 30% and a temperature of 0 to 50° C., thereby starting the etching of the silicon substrate 10. At this time, as in the experimental results shown in FIG. 2, the TMAH solution selectively etches only silicon but does not etch silicon dioxide. Accordingly, in this etching, the first sidewalls 15a and 15b and the element isolation insulating film 11 function as an etching mask, and the portion of the silicon substrate 10 which is not covered with this etching mask comes to be selectively etched.

Moreover, as in the experimental results shown in FIG. 4, the etch rate of silicon doped with p-type impurities in the TMAH solution is slow. Accordingly, the gate electrode 14c into which boron ions are implanted at a high concentration in the step of FIG. 5A is hardly etched by this TMAH solution.

In addition, in etching using the TMAH solution, (111) planes of the silicon substrate 10 are neatly exposed to the outside, instead of curved surfaces as in Non-Patent Document 1. Accordingly, first and second recesses (holes) 10a and 10b having these (111) planes as first and second side surfaces 10c and 10d are formed.

The depths of the first and second recesses 10a and 10b are controlled of the etching time, and set to an optimum value in a range of approximately 20 to 70 nm in the present embodiment.

Moreover, since the above-described etching also proceeds in the horizontal direction, the upper end portions 10e and 10f of the recesses 10a and 10b, which are closer to the gate electrode 14c, go under the first sidewalls 15a and 15b by a distance d. As described previously, the etch rate of the silicon substrate 10 in a TMAH solution depends on the concentration of impurities in silicon. Accordingly, the above-described distance d can be controlled by adjusting the concentrations of impurities in the source/drain extensions 16a and 16b and the source/drain regions 17a and 17b.

Moreover, as shown in the experimental results of FIG. 2, silicon dioxide is hardly etched by a TMAH solution. Accordingly, when the recesses 10a and 10b are being formed by etching in a TMAH solution, the etch rate of the silicon substrate 10 decreases near the sidewalls 15a and 15b made of silicon dioxide. Consequently, the rate at which the upper end portions 10e and 10f go under the sidewalls 15a and 15b due to etching is slow compared to other portions, and the above-described entry length d can be easily controlled. Furthermore, the entry length d is also determined by the substrate temperature when the first sidewall insulating layer 15 is formed, and therefore can also be controlled by the relevant substrate temperature. This also applies to each embodiment to be described later.

Note that use of an organic alkaline solution instead of a TMAH solution also makes it possible to expose neat (111) planes at the first and second side surfaces 10c and 10d and to control the entry length d of each recess 10a and 10b.

Figure 5E:
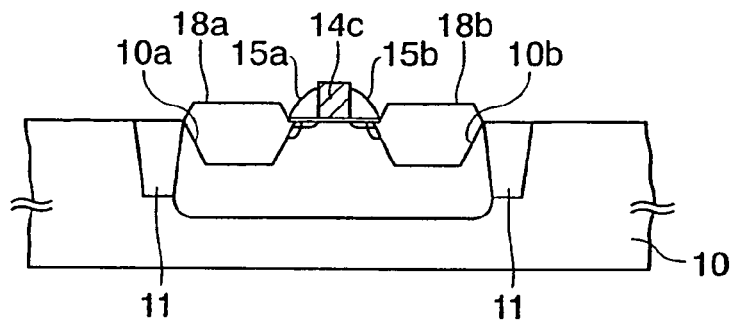

Next, steps to be performed before the cross-sectional structure shown in FIG. 5E is obtained will be described.

First, the silicon substrate 10 is put into a chamber (not shown) for epitaxial growth, and the substrate temperature is stabilized. Then, a SiGe layer with a Ge concentration of 3 to 30% is selectively epitaxially grown in each of the recesses 10a and 10b by supplying a silane-based gas or the like to the inside of the chamber. The SiGe layers selectively grow only on silicon but do not grow on the element isolation insulating film 11 and the first sidewalls 15a and 15b, which are made of silicon dioxide.

Thereafter, when the thicknesses of the SiGe layers, which are measured from the bottom surfaces of the respective recesses 10a and 10b, reach an optimum value of approximately 20 to 120 nm, the epitaxial growth is stopped, and the obtained SiGe layers are used as first and second source/drain material layers 18a and 18b.

The thicknesses of the source/drain material layers 18a and 18b are not limited to the above. However, the distances between the bottom surface of the n-well 12 and the upper surfaces of the source/drain material layers 18a and 18b are increased by forming the upper surfaces of the source/drain material layers 18a and 18b at positions higher than the surface of the silicon substrate 10 as in the present embodiment. This increases the distances between the p-n junction at the bottom surface of the n-well 12 and conductive plugs to be formed on the source/drain material layers 18a and 18b later. Thus, a junction leakage in the above-described p-n junction can be suppressed, and the reliability of the transistor can be improved.

Moreover, in the above, the source/drain material layers 18a and 18b are formed after the source/drain regions 17a and 17b have been formed. However, the order of formation of these is not particularly limited. The source/drain regions 17a and 17b may be formed after the source/drain material layers 18a and 18b have been formed.

Next, in the present embodiment, boron ions are implanted as p-type impurities into the source/drain material layers 18a and 18b under the following optimized conditions: the acceleration energy is approximately 0.5 to 20 keV, and the dose is approximately $1 \times 10^{14}$ to $1 \times 10^{16}$ cm$^{-2}$. Then, the impurities in the source/drain regions 17a and 17b are activated by performing activation anneal under the following conditions; for example, the substrate temperature is approximately 950 to 1050° C. In the case where in-situ doping is performed when the source/drain regions 17a and 17b are formed, impurity implantation and heat treatment may be omitted.

Figure 5F:
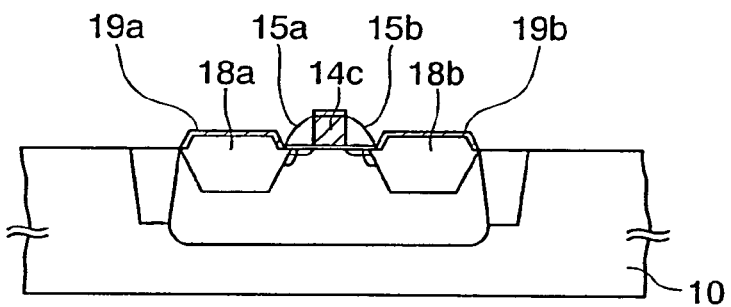

Subsequently, as shown in FIG. 5F, for example, nickel layers as refractory metal layers are formed by sputtering, and then a reaction is caused between nickel and silicon by heat treatment, thereby forming first and second nickel silicide layers 19a and 19b on the source/drain material layers 18a and 18b. A nickel silicide layer is also formed on the surface layer of the gate electrode 14c, whereby the gate electrode 14c has a polycide structure. Thereafter, an unreacted nickel layer is removed by wet etching.

Note that, instead of the nickel layers, cobalt layers may be formed as refractory metal layers.

Figure 5G:
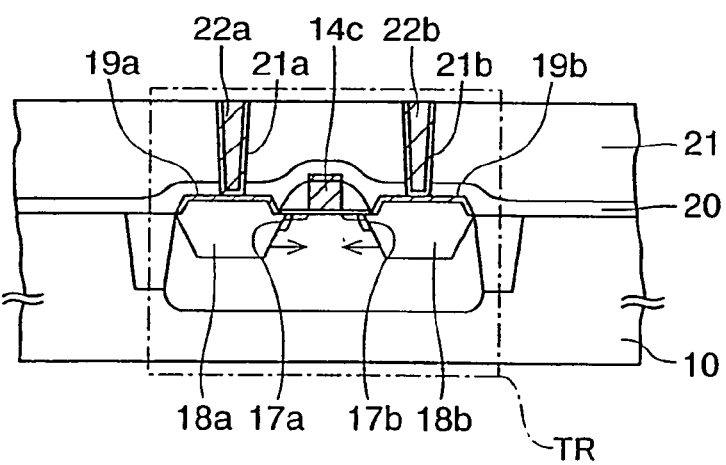

Next, steps to be performed before the cross-sectional structure shown in FIG. 5G is obtained will be described.

First, a silicon nitride layer is formed as a cover insulating layer 20 on the entire surface by plasma CVD, and then a silicon dioxide layer is formed by high-density CVD (HD-PCVD) which is excellent in filling capability. The silicon dioxide layer is used as an interlayer insulating layer 21. Thereafter, in order to planarize projections and depressions formed on the upper surface of the interlayer insulating layer 21 under the influence of projections and depressions of the gate electrode 10c and the like, the upper surface of the interlayer insulating layer 21 is polished and planarized by chemical mechanical polishing (CMP).

Subsequently, the interlayer insulating layer 21 and the cover insulating layer 20 are patterned by photolithography, thus forming first and second holes 21a and 21b having depths which reach the nickel silicide layers 19a and 19b. Then, a TiN layer is formed as a glue layer in the first and second holes 21a and 21b and on the upper surface of the interlayer insulating layer 21 by sputtering, and a tungsten layer is further formed thereon by CVD, whereby the holes 21a and 21b are completely filled with the tungsten layer. Thereafter, redundant portions of the tungsten layer and the glue layer, which are formed on the interlayer insulating layer 21, are polished by CMP to be removed, but these films are left as first and second conductive plugs 22a and 22b in the holes 21a and 21b.

Thereafter, the step of forming metal interconnections electrically connected to the conductive plugs 22a and 22b on the interlayer insulating layer 21 is taken, but details thereof will be omitted.

Through the above-described steps, the basic structure of a p-type MOS transistor TR in which the source/drain material layers 18a and 18b are buried in the recesses 10a and 10b is completed.

In the MOS transistor TR, silicon lattice in the silicon substrate 10 is forcefully stretched so as to match the large lattice spacing of SiGe due to a mismatch between the lattice constant of the silicon substrate 10 and those of the source/drain material layers 18a and 18b, and stress in the directions of the arrows in the drawing are applied to a channel under the gate electrode 14c. As a result, compared to the case where stress is not applied, the mobility of carriers in the channel is improved, and the drive capability of the MOS transistor can be improved.

According to the above-described embodiment, in the step of FIG. 5D, a TMAH solution or an organic alkaline solution has been used as an etchant for forming the first and second recesses 10a and 10b. Accordingly, one (111) plane automatically appears at the first or second side surface 10c or 10d of each recess 10a and 10b, and the shape of each recess 10a or 10b can be easily controlled. Consequently, even when MOS transistors configured as described above are integrally formed in the silicon substrate 10, the shapes of the recesses 10a and 10b are less prone to vary among the MOS transistors, compared to Non-Patent Document 1 in which the first and second side surfaces 10c and 10d become curved surfaces. This makes it possible to suppress variation in characteristics of MOS transistors among elements and to improve the reliability of a semiconductor device such as an LSI.

Figure 6:
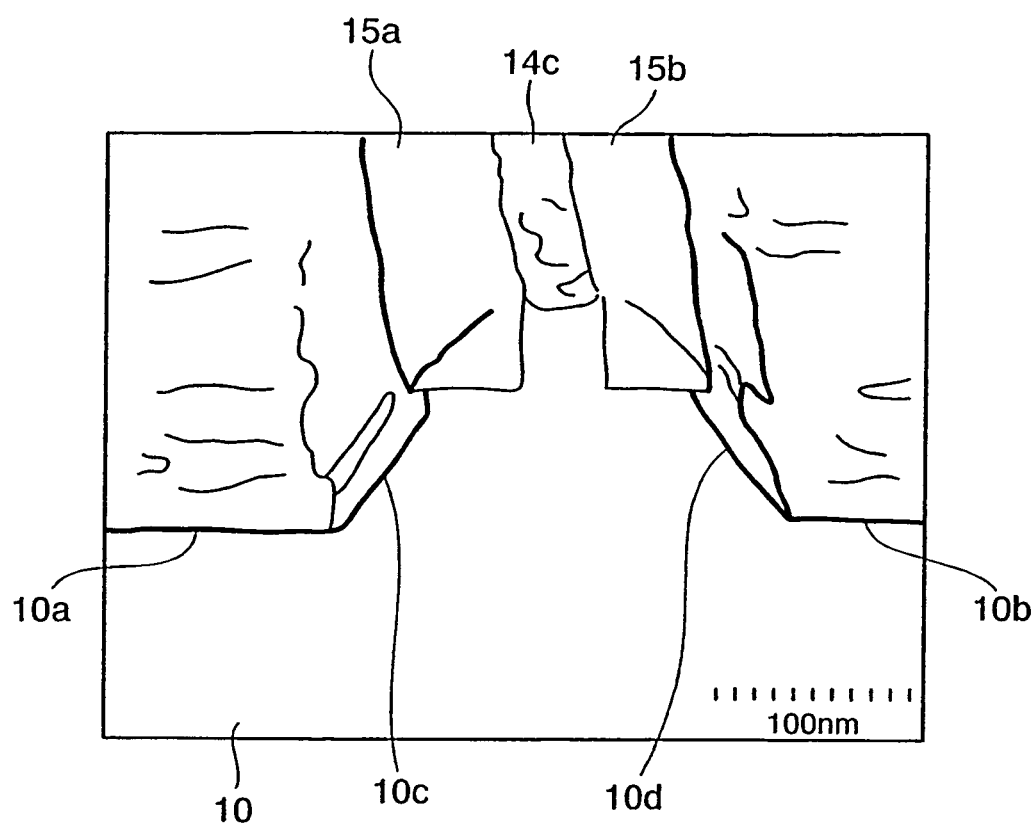
FIG. 6 is a view drawn based on an SEM image of recesses after the recesses have been formed according to the second embodiment of the present invention.

FIG. 6 is a view drawn based on a scanning electron microscope (SEM) image of recesses 10a and 10b after the recesses 10a and 10b have been formed in accordance with the present embodiment. As shown in this drawing, (111) planes appear at the first and second side surfaces 10c and 10d constituting side surfaces of the first and second recesses 10a and 10b.

The distance d to which each recess 10a or 10b goes under the first sidewall 15a or 15b is not particularly limited.

Figure 7:
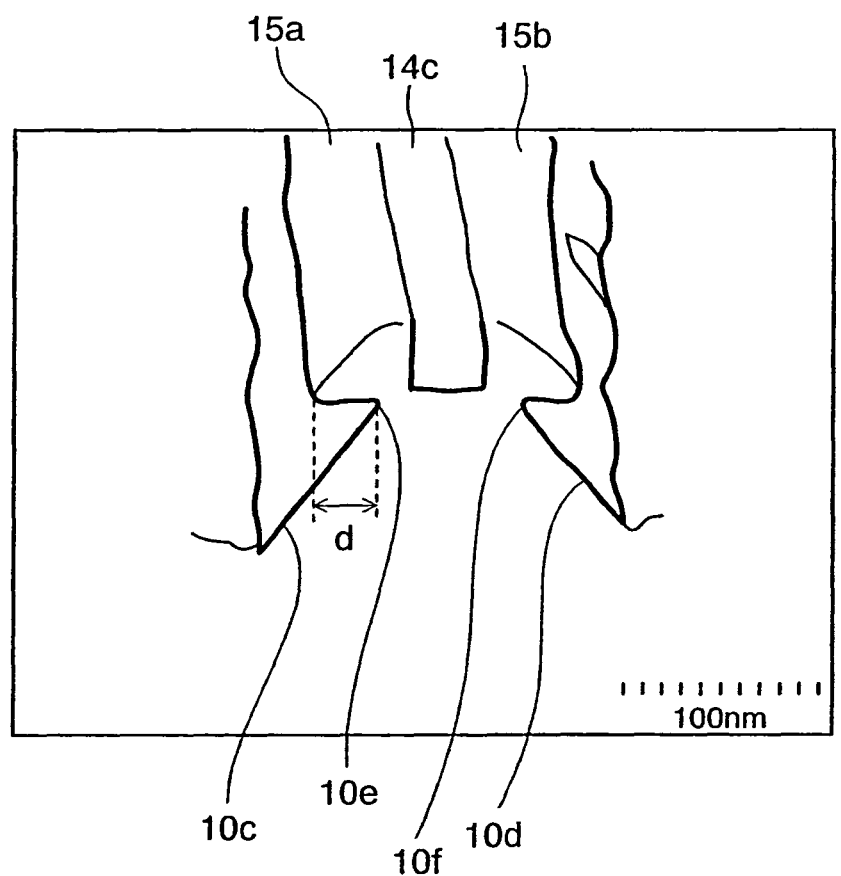
FIG. 7 is a view drawn based on an SEM image in the case where the distance d, by which each recess goes under a sidewall, is increased by adjusting the substrate temperature when the first sidewall insulating layer is formed in the second embodiment of the present invention.

FIG. 7 is a view drawn based on an SEM image in the case where the above-described distance d is increased by adjusting the substrate temperature when the first sidewall insulating layer 15 is formed.

When the entry length d is made large as described above, the distances between the channel under the gate electrode 10c and the upper end portions 10e and 10f of the recesses 10a and 10b become short. Accordingly, stress can be efficiently applied from the upper end portions 10e and 10f to the channel. Such an advantage can also be obtained in each embodiment to be described later.

Incidentally, the present embodiment is not limited to the above. For example, the source/drain material layers 18a and 18b may be constituted of metal layers made of a noble metal such as Pt (platinum), instead of the SiGe layers. In this case, the fabricated transistor TR is a Schottky transistor. This also applies to each embodiment to be described later.

(3) Third Embodiment

Next, a method of manufacturing a semiconductor device according to a third embodiment of the present invention will be described.

Figure 8A:
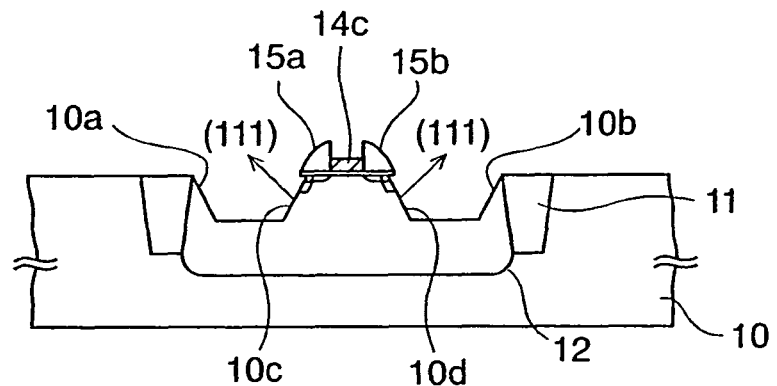
FIGS. 8A to 8C are cross-sectional views of a semiconductor device according to a third embodiment of the present invention in the process of manufacture.
Figure 8B:
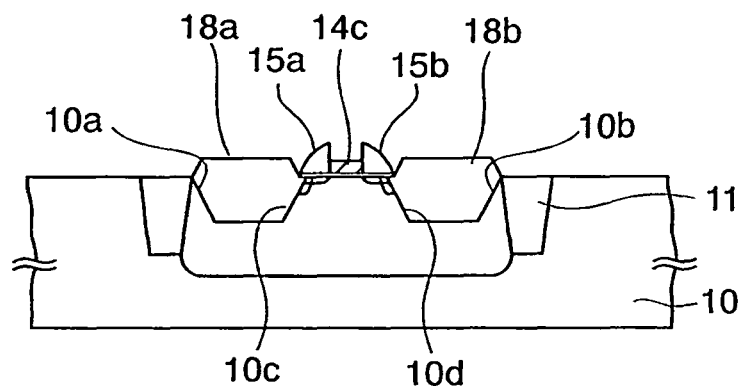
Figure 8C:
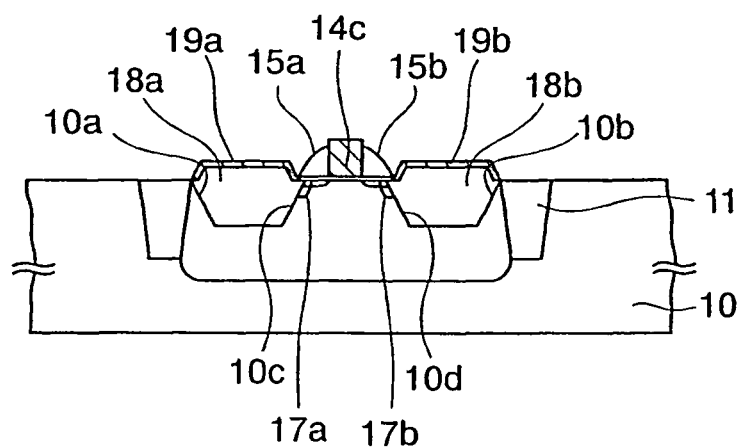

FIGS. 8A to 8C are cross-sectional views of a semiconductor device according to the present embodiment in the process of manufacture. Note that the components already described in the second embodiment are denoted by the same reference numerals and codes in these drawings and will not be further described below.

First, in accordance with the second embodiment, the structure shown in FIG. 5A is completed. However, though ions of p-type impurities have been implanted into the polysilicon layer 14 at a high concentration sufficient to inhibit the etching of polysilicon in the TMAH solution from proceeding in the second embodiment, ions of p-type impurities are implanted into the polysilicon layer 14 at a low concentration at which the polysilicon layer 14 is etched by a TMAH solution partway in the present embodiment. In the present embodiment, boron is adopted as such p-type impurities, and ions thereof are implanted into the above-described polysilicon layer 14 under the following conditions: the acceleration energy is approximately 0.5 to 20 keV, and the dose is approximately $1 \times 10^{13}$ to $5 \times 10^{15}$ cm$^{-3}$.

Thereafter, the structure shown in FIG. 5C is obtained in accordance with the aforementioned second embodiment.

Next, steps to be performed before the cross-sectional structure shown in FIG. 8A is obtained will be described.

First, the silicon substrate 10 is immersed in a TMAH solution having a volume concentration of 5 to 30% and a temperature of 0 to 50° C., thereby starting the etching of the silicon substrate 10. At this time, since the concentration of the p-type impurities introduced into the polysilicon layer 14 constituting the gate electrode 14c has been set low in advance, not only the silicon substrate 10 but also the upper surface of the gate electrode 14c are etched in this etching.

Then, when the depths of the first and second recesses 10a and 10b reach approximately 20 to 70 nm and the thickness of the gate electrode 14c is reduced to approximately 30 to 150 nm, the above-described etching is stopped. Thus, as shown in the drawing, a structure can be obtained, in which the first and second recesses 10a and 10b having the first and second side surfaces 10c and 10d constituted of (111) planes are formed, and in which the height of the gate electrode 14c is smaller than those of the first sidewalls 15a and 15b.

Subsequently, as shown in FIG. 8B, SiGe layers to be used as first and second source/drain material layers 18a and 18b are selectively epitaxially grown in the first and second recesses 10a and 10b by performing the aforementioned step of FIG. 5E.

Next, in the present embodiment, boron ions are implanted as p-type impurities into the source/drain material layers 18a and 18b under the following optimized conditions: the acceleration energy is approximately 0.5 to 20 keV, and the dose is approximately $1 \times 10^{14}$ to $1 \times 10^{16}$ cm$^{-2}$. Thereafter, the impurities in the source/drain regions 17a and 17b are activated by performing activation anneal under the following conditions: for example, the substrate temperature is approximately 950 to 1050° C. In the case where in-situ doping is performed when the source/drain regions 18a and 18b are formed, impurity implantation and heat treatment may be omitted. Next, as shown in FIG. 8C, nickel layers are respectively formed as refractory metal layers on the first and second source/drain material layers 18a and 18b and the gate electrode 14c by sputtering, and then a reaction is caused between nickel and silicon by heat treatment, thereby forming nickel silicide layers 19a and 19b on the first and second source/drain material layers 18a and 18b made of SiGe layers. This silicidation also occurs in the gate electrode 14c. However, since the thickness of the gate electrode 14c has been reduced in the step of FIG. 8A in advance, the silicidation occurs in the entire gate electrode 14c, and the gate electrode 14c becomes a metal gate made of nickel silicide.

Note that, instead of the nickel layers, cobalt layers, platinum layers, or layers of a mixture of cobalt and platinum may be adopted as refractory metal layers.

Thereafter, the aforementioned step of FIG. 5G is performed, thereby completing the basic structure of a MOS transistor.

According to the present embodiment described above, the first or second side surface 10c or 10d of each recess 10a or 10b can be constituted of one (111) plane similarly to the second embodiment.

Furthermore, in the present embodiment, the concentration of the p-type impurities introduced into the gate electrode 14c is set lower than that in the second embodiment, whereby the gate electrode 14c is etched simultaneously with the formation of the recesses 10a and 10b using the TMAH solution and the height of the gate electrode 14c is reduced.

This allows the gate electrode 14c to become a metal gate by silicidation simultaneously with the formation of the nickel silicide layers 19a and 19b by siliciding the first and second source/drain material layers 18a and 18b, and therefore allows compatibility between a formation process of the metal gate and that of the recesses 10a and 10b.

Incidentally, in the above, the TMAH solution has been used as an etchant when the recesses 10a and 10b are formed. However, an advantage similar to the above can also be obtained when an organic alkaline solution is used instead of the TMAH solution.

(4) Fourth Embodiment

Next, a method of manufacturing a semiconductor device according to a fourth embodiment of the present invention will be described.

FIGS. 9A to 9D are cross-sectional views of a semiconductor device according to the present embodiment in the process of manufacture. Note that the components already described in the second embodiment are denoted by the same reference numerals and codes in these drawings and will not be further described below.

Figure 9A:
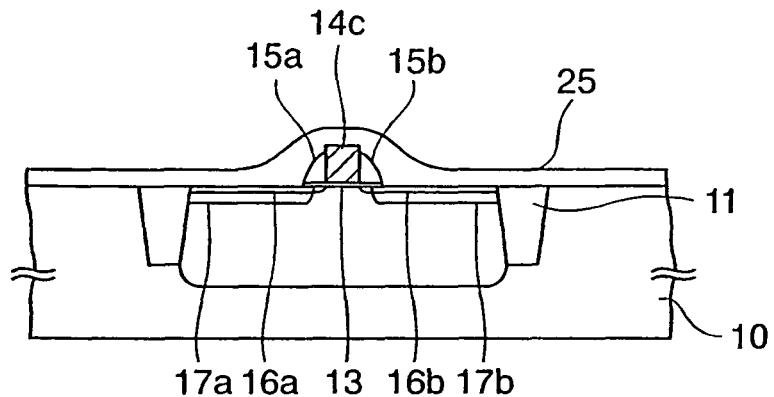
FIGS. 9A to 9D are cross-sectional views of a semiconductor device according to a fourth embodiment of the present invention in the process of manufacture.

First, after the cross-sectional structure shown in FIG. 5C has been obtained in accordance with the aforementioned second embodiment, a silicon dioxide layer having a thickness of approximately 5 to 100 nm is formed as a second sidewall insulating layer 25 on the silicon substrate 10, the first sidewalls 15a and 15b, and the gate electrode 14c, as shown in FIG. 9A. A method of forming the silicon dioxide layer is not particularly limited. However, in the present embodiment, the silicon dioxide layer is formed by CVD using silane as reactant gas. Further, instead of the silicon dioxide layer, a silicon nitride layer may be formed as the second sidewall insulating layer 25.

Figure 9B:
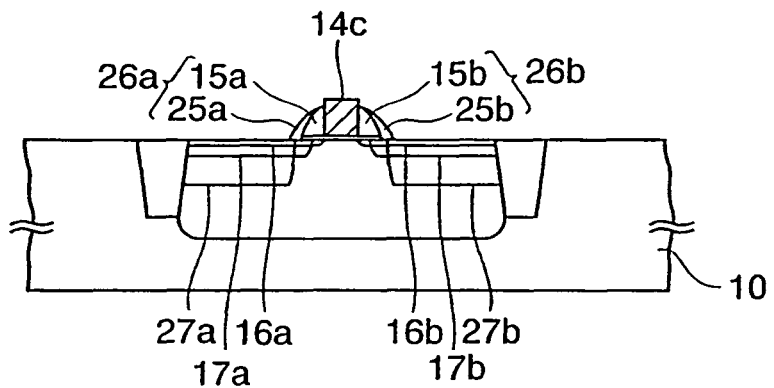

Next, steps to be performed before the cross-sectional structure shown in FIG. 9B is obtained will be described.

First, the second sidewall insulating layer 25 is etched back by plasma etching to leave second sidewalls 25a and 25b on the side surfaces of the first sidewalls 15a and 15b. Sidewalls 26a and 26b each including two insulating layers as described above are also referred to as double sidewalls.

Subsequently, using the second sidewalls 25a and 25b and the gate electrode 14c as a mask, ions of, for example, arsenic are implanted as n-type impurities into the silicon substrate 10 under the following conditions: the acceleration energy is approximately 3 to 20 keV, and the dose is $1 \times 10^{14}$ to $5 \times 10^{15}$ cm$^{-2}$. Thus, in the silicon substrate 10, first and second impurity diffusion regions 27a and 27b of a second conductivity type (n-type) are formed more deeper than the source/drain extensions 16a and 16b of the first conductivity type (p-type).

Figure 9C:
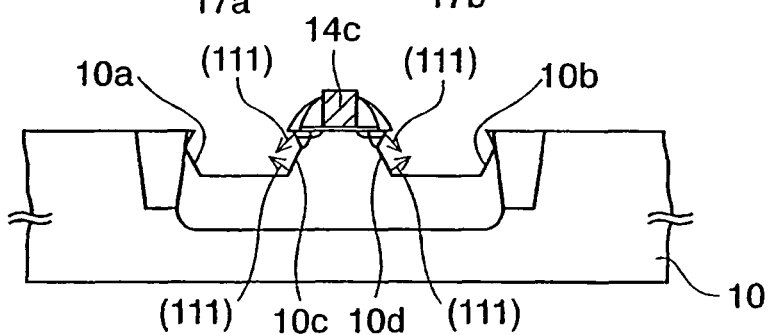

Next, steps to be performed before the cross-sectional structure shown in FIG. 9C is obtained will be described.

First, the silicon substrate 10 is immersed in a TMAH solution having a volume concentration of 5 to 30% and a temperature of 0 to 50° C., thereby starting the etching of the silicon substrate 10. Thus, first and second recesses 10a and 10b having depths of approximately 20 to 80 nm, which are deeper than that of the source/drain extensions 16a and 16b, are formed in the silicon substrate 10 beside the gate electrode 14c.

At this time, as apparent from the experimental results described using FIG. 4, silicon into which n-type impurities are introduced has a higher etch rate in a TMAH solution, compared to silicon into which p-type impurities are introduced. Accordingly, the etching of the first and second impurity diffusion regions 27a and 27b into which the n-type impurities (arsenic) are introduced proceeds faster in the TMAH solution compared to those of the first and second source/drain extensions 16a and 16b and the source/drain regions 17a and 17b into which the p-type impurities (boron) are introduced.

In the case where etch rates differ between two layers as described above, different etched surfaces are exposed to the outside on opposite sides of the interface between these layers. Accordingly, at the first and second side surfaces 10c and 10d of each of the recesses 10a and 10b, (111) planes appear in portions which are in contact with the first and second impurity diffusion regions 27a and 27b of the p-type, whereas other (111) planes different from the above-described ones appear in portions which are in contact with the first and second source/drain extensions 16a and 16b and the source/drain regions 17a and 17b, which are of the n-type.

As a result, in the present embodiment, the first and second recesses 10a and 10b can be obtained in which each of the first and second side surfaces 10c and 10d is constituted of two different (111) planes and in which the cross-sectional shapes of the first and second side surfaces 10c and 10d are concave shapes recessed below the gate electrode 14c.

Note that the recesses 10a and 10b having the above-described cross-sectional shapes can also be formed using an organic alkaline solution instead of the TMAH solution.

Figure 9D:
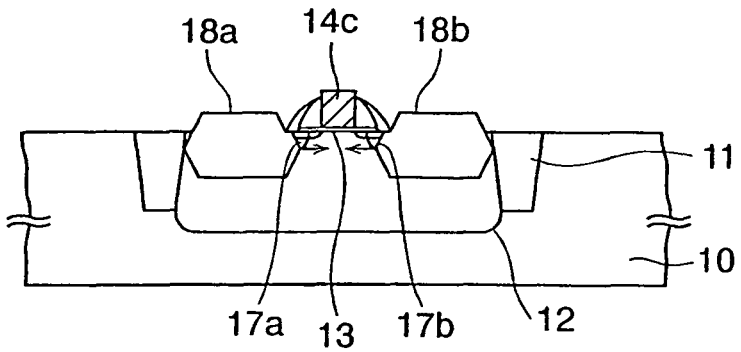

Thereafter, as shown in FIG. 9D, SiGe layers are selectively epitaxially grown in the recesses 10a and 10b by performing the aforementioned step of FIG. 5E, respectively. The SiGe layers are used as first and second source/drain material layers 18a and 18b.

Thereafter, the aforementioned steps of FIGS. 5F and 5G are performed, thereby completing the basic structure of a MOS transistor.

According to the present embodiment described above, as shown in FIG. 9B, at positions deeper than the first and second source/drain extensions 16a and 16b and the source/drain regions 17a and 17b, which are of the p-type, the first and second impurity diffusion regions 27a and 27b of the n-type, which is opposite to the conductivity type of the foregoing, have been formed. Due to this difference in conductivity type, different (111) planes appear at each of the first and second side surfaces 10c and 10d of the first and second recesses 10a and 10b when these recesses 10a and 10b are formed using the TMAH solution in the step of FIG. 9C, and the first and second recesses 10a and 10b can be obtained in which the cross-sectional shapes of the first and second side surfaces 10c and 10d are concave shapes recessed below the gate electrode 14c.

Figure 10:
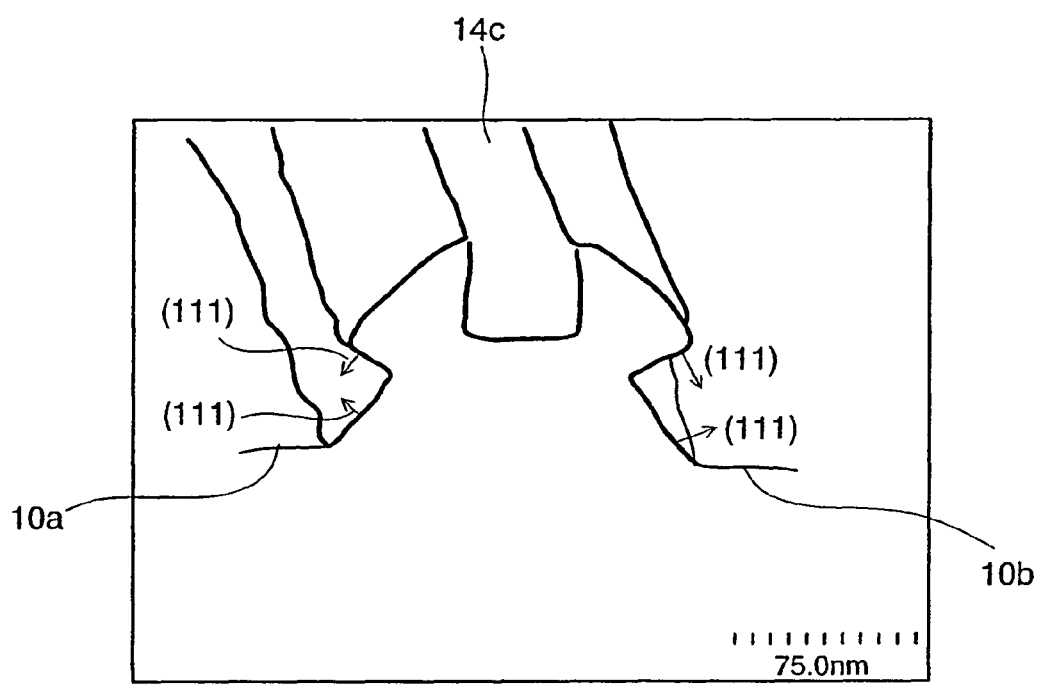
FIG. 10 is a view drawn based on an SEM image of recesses after the recesses have been formed according to the fourth embodiment of the present invention.

FIG. 10 is a view drawn based on an SEM image of recesses 10a and 10b after the recesses 10a and 10b have been formed in accordance with the present embodiment. As shown in this drawing, two different (111) planes appear at each of the respective side surfaces of the first and second recesses 10a and 10b.

Such a recess shape makes characteristics of interface between the silicon substrate 10 and the gate insulating film 13 less prone to being deteriorated by stress because the stress has a peak at a position slightly deeper than the surface of the silicon substrate 10 as represented by the arrows in FIG. 9D, and therefore can achieve excellent reliability of the MOS transistor while improving the drive characteristics thereof.

(5) Fifth Embodiment

Next, a method of manufacturing a semiconductor device according to a fifth embodiment of the present invention will be described.

FIGS. 11A to 11E are cross-sectional views of a semiconductor device according to the present embodiment in the process of manufacture. Note that the components already described in the second to fourth embodiments are denoted by the same reference numerals and codes in these drawings and will not be further described below.

As described below, a silicon-on-insulator (SOI) substrate is used as a semiconductor substrate in the present embodiment.

Figure 11A:
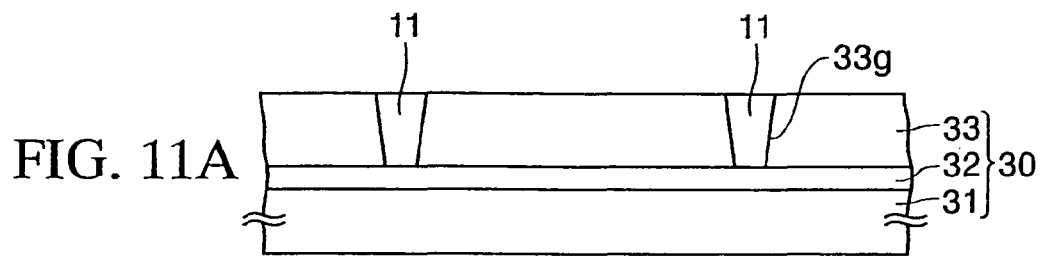
FIGS. 11A to 11E are cross-sectional views of a semiconductor device according to a fifth embodiment of the present invention in the process of manufacture.

To begin with, steps to be performed before the cross-sectional structure shown in FIG. 11A is obtained will be described.

First, an SOI substrate 30 in which a buried insulating layer 32 and a silicon layer 33 are formed on a silicon substrate 31 is prepared by, for example, bond-and-etch-back technique. Then, an element isolation trench 33g having a depth which reaches the buried insulating layer 32 is formed in the silicon layer 33. Furthermore, a silicon dioxide layer is buried as an element isolation insulating film 11 in the element isolation trench 33g.

The surface orientation of the silicon layer 33 is not particularly limited. However, in the present embodiment, the silicon layer 33 is formed so that the orientation thereof becomes (001). Further, a silicon dioxide layer having a thickness of, for example, approximately 5 to 100 nm is formed as the buried insulating layer 32.

Figure 11B:
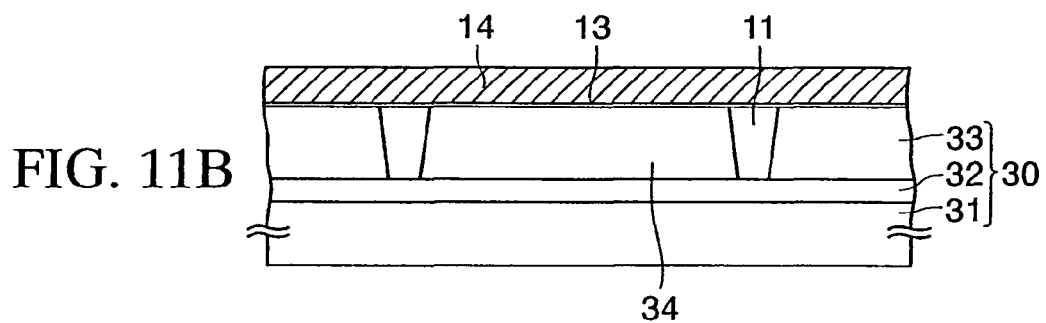

Next, as shown in FIG. 11B, an n-well 34 is formed in a p-type MOS transistor formation region delimited by the element isolation insulating film 11 by implanting phosphorus ions as n-type impurities into the silicon layer 33 under the following conditions: the acceleration energy is approximately 300 keV or more, and the dose is $1\times10^{13}$ cm$^{-3}$ or more.

Subsequently, the surface of the silicon layer 33 is thermally oxidized, thus forming a gate insulating film 13 which is made of silicon dioxide and which has a thickness of approximately 0.5 to 5.0 nm. Here, a gate insulating film in which a very small amount of nitrogen is added to silicon dioxide may be adopted as the gate insulating film 13. Further, a polysilicon layer 14 having a thickness of approximately 10 to 300 nm is formed on the gate insulating film 13 by LPCVD using silane, and then ions of p-type impurities are implanted into the polysilicon layer 14 at a concentration which is similar to that of the second embodiment and at which the etching of polysilicon in a TMAH solution does not proceed.

Figure 11C:
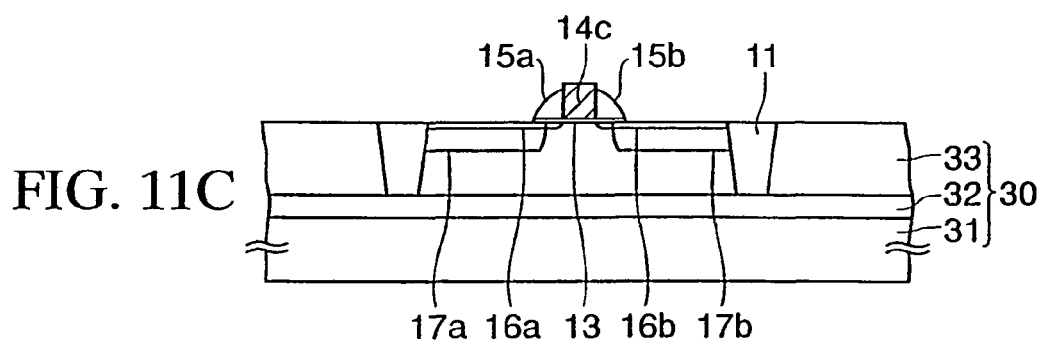

Thereafter, the structure shown in FIG. 11C is obtained by performing the aforementioned steps of FIGS. 5B and 5C. In this structure, the first and second source/drain extensions 16a and 16b and the source/drain regions 17a and 17b are formed in the silicon layer 33 beside the gate electrode 14c.

Next, the silicon substrate 10 is immersed in a TMAH solution having a volume concentration of 5 to 30% and a temperature of 0 to 50° C., thereby starting the etching of the silicon substrate 10. Thus, as shown in FIG. 1D, first and second recesses 33a and 33b having depths of approximately 5 to 50 nm are formed in the silicon layer 33 beside the gate electrode 14c.

According to the experimental results shown in FIG. 2, a TMAH solution selectively etches only silicon but does not etch silicon dioxide. Accordingly, in this etching, the etch rate of the silicon layer 33 becomes low in the vicinities of the gate insulating film 13 and the buried insulating layer 32, which are made of silicon dioxide, whereas the etch rate becomes fast in a portion located apart from these insulating layers. Due to such a difference in etch rate, each of the first and second side surfaces 33c and 33d constituting the side surfaces of the recesses 33a and 33b is not constituted of a single crystal plane but constituted of two different (111) planes, and the cross-sectional shape thereof becomes convex.

The recesses 33a and 33b having the above-described cross-sectional shapes can also be formed using an organic alkaline solution instead of the TMAH solution.

Figure 11D:
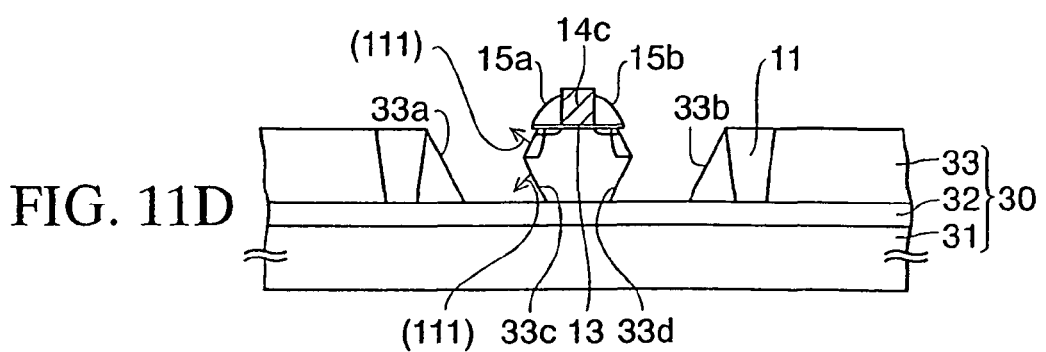
Figure 11E:
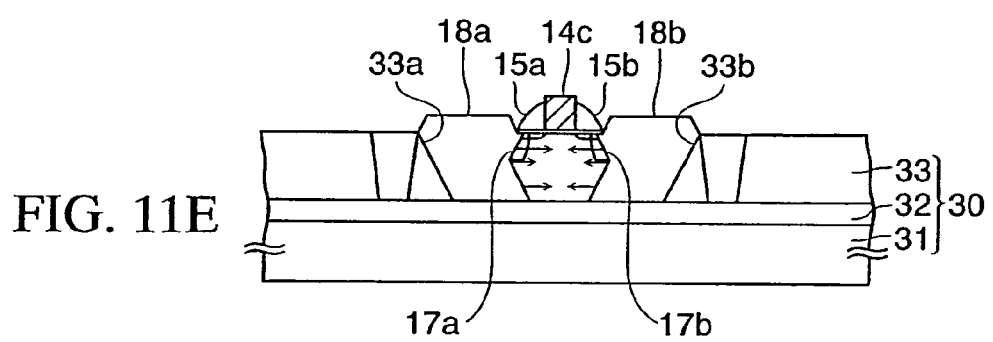

Thereafter, as shown in FIG. 11E, SiGe layers are selectively epitaxially grown in the recesses 33a and 33b by performing the aforementioned step of FIG. 5E, respectively. The SiGe layers are used as first and second source/drain material layers 18a and 18b.

Thereafter, the aforementioned steps of FIGS. 5F and 5G are performed, thereby completing the basic structure of a MOS transistor.

According to the present embodiment described above, in the etching using the TMAH solution which has been described in FIG. 11D, the etch rate of the silicon layer 33 becomes low in the vicinity of the gate insulating film 13 and in the vicinity of the buried insulating film 32 partially constituting the SOI substrate 30. As a result, the etch rate of the silicon layer 33 varies depending on the depth. Accordingly, each of the first and second side surfaces 33c and 33d of the first and second recesses 33a and 33b obtained by the above-described etching is constituted of two different (111) planes, and the cross-sectional shape thereof becomes convex.

As represented by the arrows in FIG. 11E, the first and second source/drain material layers 18a and 18b formed in the recesses 33a and 33b having the above-described cross-sectional shapes generate strong stress at the upper and lower surfaces of the silicon layer 33. A stress distribution can be obtained in which stress becomes weak at the intermediate position of the film where both (111) planes intersect each other.

(6) Sixth Embodiment

Next, a method of manufacturing a semiconductor device according to a sixth embodiment of the present invention will be described.

FIGS. 12A to 12D are cross-sectional views of a semiconductor device according to the present embodiment in the process of manufacture. In these drawings, the components already described in the second to fourth embodiments are denoted by the same reference numerals and codes and will not be further described below.

In the aforementioned fifth embodiment, the first and second recesses 33a and 33b having convex cross-sectional shapes are formed by using the SOI substrate 30. On the other hand, in the present embodiment, recesses having the same cross-sectional shapes as the above-described ones are formed using not an SOI substrate but a general silicon substrate.

Figure 12A:
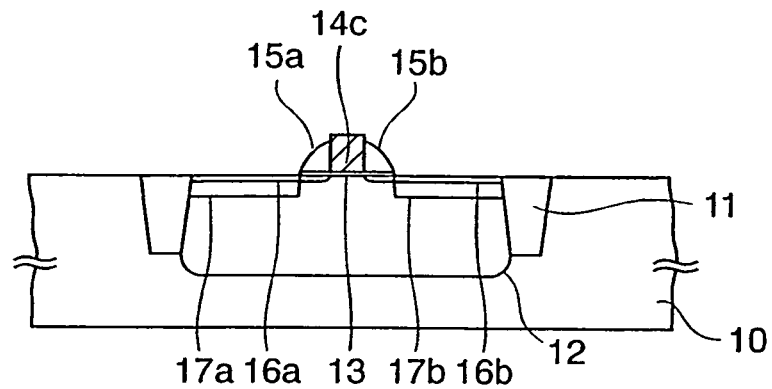
FIGS. 12A to 12D are cross-sectional views of a semiconductor device according to a sixth embodiment of the present invention in the process of manufacture.

First, the cross-sectional structure shown in FIG. 12A is obtained by performing the aforementioned steps of FIGS. 5A to 5C.

Figure 12B:
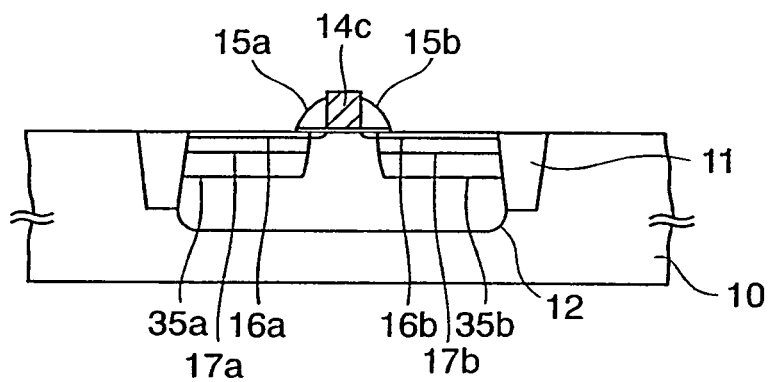

Subsequently, as shown in FIG. 12B, boron ions are implanted as p-type impurities which have the effect of delaying etching in a TMAH solution, into the silicon substrate 10 using the gate electrode 14c and the first sidewalls 15a and 15b as a mask, thus forming third and fourth impurity diffusion regions 35a and 35b of the p-type. As conditions for this ion implantation, conditions are adopted under which the third and fourth impurity diffusion regions 35a and 35b have higher concentrations and deeper depths than the source/drain extensions 16a and 16b and the source/drain regions 17a and 17b, which are of the p-type. In the present embodiment, as such conditions, for example, boron implantation under conditions where the acceleration energy is approximately 1 to 20 keV and where the dose is approximately $5 \times 10^{14}$ to $2 \times 10^{16}$ cm$^{-2}$ is adopted. As a result of such ion implantation, the third and fourth impurity diffusion regions 35a and 35b which are of the p-type and which densely spread to portions of the silicon substrate 10 that are at deeper positions than the source/drain regions 17a and 17b are formed.

Thereafter, activation anneal is performed by adopting the same conditions as those in the second embodiment, thus activating the impurities in the source/drain regions 17a and 17b.

Incidentally, the order of formation of the third and fourth impurity diffusion regions 35a and 35b and the source/drain regions 17a and 17b is not particularly limited to the above. For example, the above-described order may be reversed to form the source/drain regions 17a and 17b after the third and fourth impurity diffusion regions 35a and 35b have been formed.

Figure 12C:
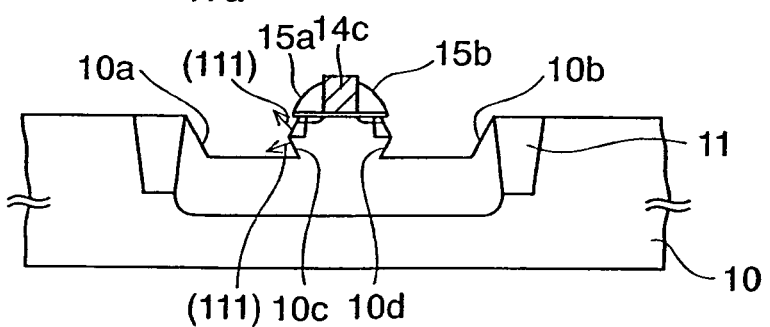

Subsequently, the silicon substrate 10 is immersed in a TMAH solution having a volume concentration of 5 to 30% and a temperature of 0 to 50° C., thereby starting the etching of the silicon substrate 10. Thus, first and second recesses 10a and 10b having depths of approximately 30 to 120 nm are formed in the silicon substrate 10 beside the gate electrode 14c as shown in FIG. 12C.

As described in FIGS. 2 and 3, in the etching of silicon in a TMAH solution, the etch rate becomes low in silicon dioxide and silicon into which p-type impurities are introduced at a high concentration. Accordingly, in this etching, the etch rate becomes low in the vicinity of the gate insulating film 13 made of silicon dioxide and in the vicinities of the third and fourth impurity diffusion regions 35a and 35b into which the p-type impurities are introduced at a high concentration, whereas the etch rate does not become low in a portion located apart from the foregoing. Due to such an uneven etch rate, each of the first and second side surfaces 10c and 10d of the respective recesses 10a and 10b is not constituted of a single crystal plane but constituted of two different (111) planes, similarly to the fifth embodiment. The cross-sectional shape thereof becomes convex.

The recesses 10a and 10b having the above-described cross-sectional shapes can also be formed using an organic alkaline solution instead of the TMAH solution.

Figure 12D:
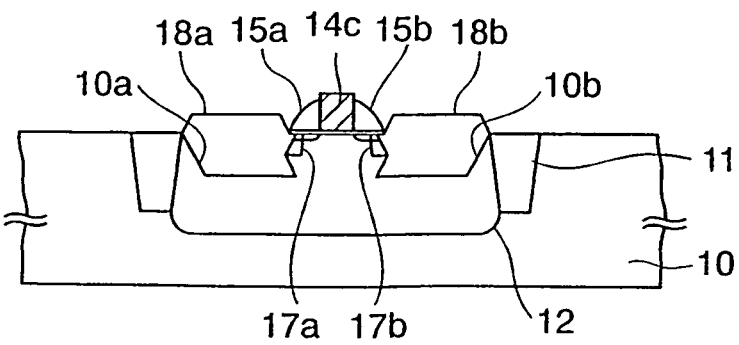

Subsequently, as shown in FIG. 12D, SiGe layers are selectively epitaxially grown in the recesses 10a and 10b by performing the aforementioned step of FIG. 5E, respectively. The SiGe layers are used as first and second source/drain material layers 18a and 18b.

Thereafter, the aforementioned steps of FIGS. 5F and 5G are performed, thereby completing the basic structure of a MOS transistor.

According to the present embodiment described above, p-type impurities which have the effect of delaying etching in a TMAH solution have been introduced into the third and fourth impurity diffusion regions 35a and 35b. Accordingly, in the etching step of FIG. 12C, the etch rate of silicon becomes low in the vicinities of the third and fourth impurity diffusion regions 35a and 35b and the gate insulating film 13. As a result, as shown in FIG. 12C, each of the first and second side surfaces 10c and 10d of the first and second recesses 10a and 10b is constituted of two (111) planes, and the first and second recesses 10a and 10b having convex cross-sectional shapes can be formed. Thus, stress favorable for the improvement in the mobility can be applied to the channel from the source/drain material layers 18a and 18b formed in the respective recesses 10a and 10b.

(7) Seventh Embodiment

Next, a method of manufacturing a semiconductor device according to a seventh embodiment of the present invention will be described.

FIGS. 13A to 13E are cross-sectional views of a semiconductor device according to the present embodiment in the process of manufacture. In these drawings, the components already described in the second to sixth embodiments are denoted by the same reference numerals and codes and will not be further described below.

In the aforementioned sixth embodiment, as shown in FIG. 12B, the third and fourth impurity diffusion regions 35a and 35b for delaying etching in the TMAH solution have been formed using the gate electrode 14c and the first sidewalls 15a and 15b as a mask for ion implantation.

On the other hand, in the present embodiment, before a gate electrode 14c is formed, an impurity diffusion region having the effect of increasing the etch rate is formed.

Figure 13A:
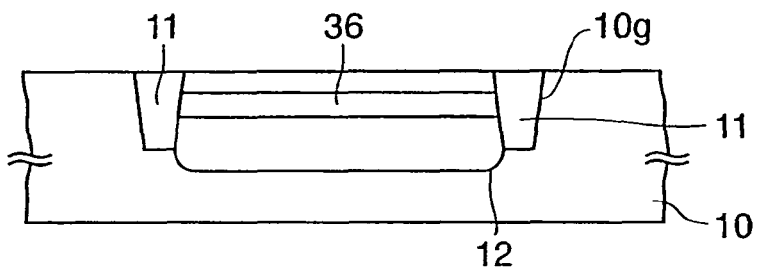
FIGS. 13A to 13E are cross-sectional views of a semiconductor device according to a seventh embodiment of the present invention in the process of manufacture.

First, as shown in FIG. 13A, an element isolation insulating film 11 is formed in an element isolation trench 10g, and then an n-well 12 is formed in a p-type MOS transistor formation region delimited by the element isolation insulating film 11.

Subsequently, boron ions are implanted as n-type impurities, which have the effect of delaying etching in a TMAH solution, into a silicon substrate 10 under conditions where the acceleration energy is approximately 5 to 30 keV and where the dose is approximately $1\times10^{13}$ to $5\times10^{15}$ cm$^{-3}$, thus forming a fifth impurity diffusion region 36 at a position deeper than source/drain regions to be formed later.

Figure 13B:
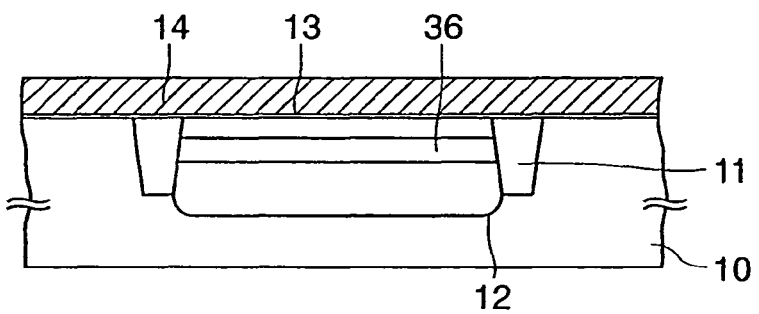

Next, as shown in FIG. 13B, a gate insulating film 13 made of silicon dioxide is formed by thermally oxidizing the surface of the silicon substrate 10, and a polysilicon layer 14 is further formed on the gate insulating film 13 by LPCVD using silane. Thereafter, adopting ion implantation conditions similar to those of the second embodiment, ions of p-type impurities are implanted into the polysilicon layer 14 at a concentration at which the etching of polysilicon in a TMAH solution does not proceed.

Figure 13C:
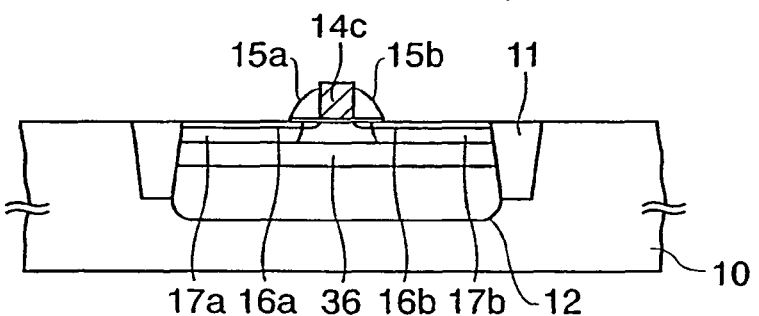

Subsequently, as shown in FIG. 13C, source/drain extensions 16a and 16b and source/drain regions 17a and 17b are formed in the silicon substrate 10 beside the gate electrode 14c by performing the aforementioned steps of FIGS. 5B and 5C.

Figure 13D:
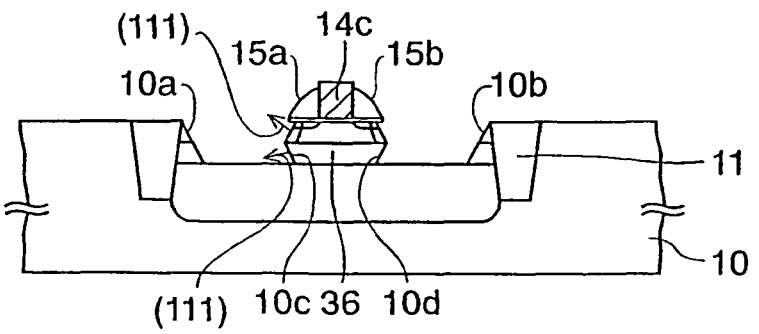

Then, the silicon substrate 10 is immersed in a TMAH solution having a volume concentration of 5 to 30% and a temperature of 0 to 50° C., thereby starting the etching of the silicon substrate 10. Thus, first and second recesses 10a and 10b having depths of approximately 20 to 150 nm are formed in the silicon substrate 10 beside the gate electrode 14c as shown in FIG. 13D.

In this etching, the etch rate of silicon increases in the vicinity of the fifth impurity diffusion region 36 into which the n-type impurities having the effect of increasing the etch rate are introduced at a high concentration, whereas the etch rate of silicon decreases in the vicinities of the source/drain extensions 16a and 16b and the source/drain regions 17a and 17b into which the p-type impurities are introduced at a high concentration. Accordingly, for the same reason as that in the sixth embodiment, each of the first and second side surfaces 10c and 10d of the respective recesses 10a and 10b is not constituted of a single crystal plane but constituted of two different (111) planes, and the cross-sectional shape thereof becomes convex.

Note that the first and second recesses 10a and 10b having cross-sectional structures similar to the above can also be formed using an organic alkaline solution instead of the TMAH solution.

Figure 13E:
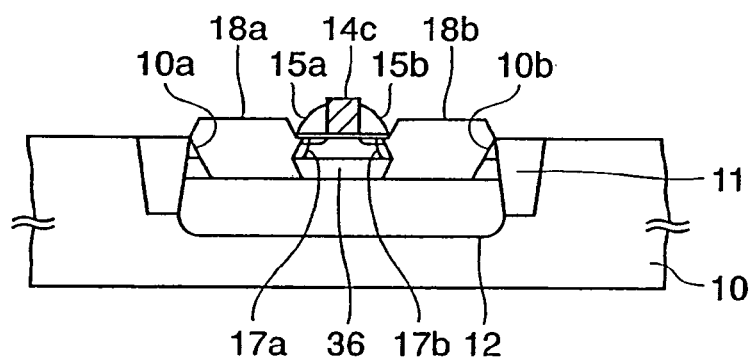

Next, as shown in FIG. 13E, SiGe layers are selectively epitaxially grown in the recesses 10a and 10b by performing the aforementioned step of FIG. 5E, respectively. The SiGe layers are used as first and second source/drain material layers 18a and 18b.

Thereafter, the aforementioned steps of FIGS. 5F and 5G are performed, thereby completing the basic structure of a MOS transistor.

According to the present embodiment described above, the fifth impurity diffusion region 36 having the effect of suppressing the etching of silicon in a TMAH solution or an organic alkaline solution has been formed at a position deeper than the source/drain regions 17a and 17b in the silicon substrate 10. Accordingly, similar to the sixth embodiment, when the first and second recesses 10a and 10b are formed by etching, the etch rate varies depending on the distance from the surface of the silicon substrate 10. Consequently, each of the first and second side surfaces 10c and 10d of the first and second recesses 10a and 10b is constituted of two (111) planes, and the first and second recesses 10a and 10b having convex cross-sectional shapes can be obtained. Thus, similar to the sixth embodiment, stress favorable for the improvement in the mobility can be applied to the channel from the source/drain material layers 18a and 18b formed in the respective recesses 10a and 10b.

(8) Eighth Embodiment

Figure 14A:
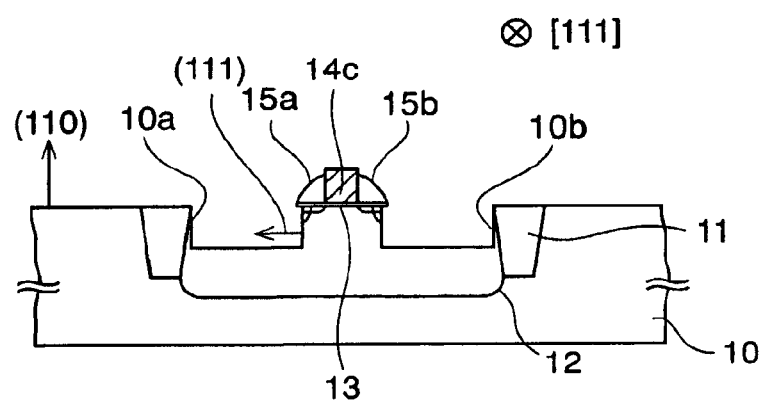
FIGS. 14A and 14B are cross-sectional views of a semiconductor device according to an eighth embodiment of the present invention in the process of manufacture.
Figure 14B:
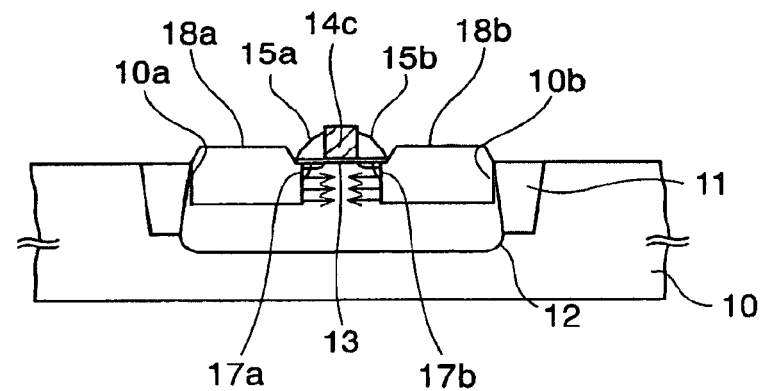
Figure 15:
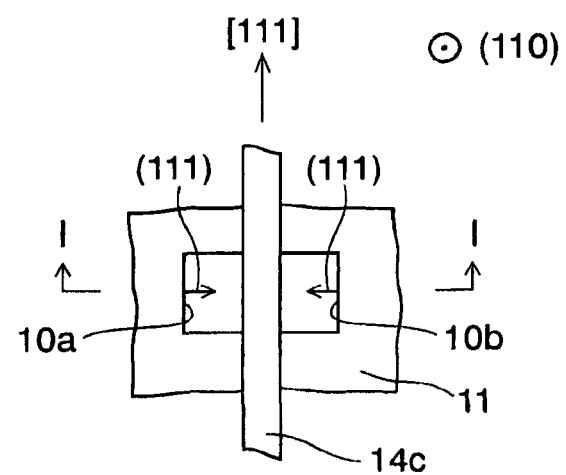
FIG. 15 is a plan view of the semiconductor device according to the eighth embodiment of the present invention in the process of manufacture.

FIGS. 14A and 14B are cross-sectional views of a semiconductor device according to an eighth embodiment of the present invention in the process of manufacture, and FIG. 15 is a plan view thereof. In these drawings, the components already described in the second to sixth embodiments are denoted by the same reference numerals and codes and will not be further described below.

In the aforementioned second to fourth embodiments, a substrate with (001) surface orientation is adopted as a silicon substrate in which a MOS transistor is fabricated, and the gate width direction (extending direction of the gate electrode) is set to the [110] direction of the silicon substrate.

On the other hand, in the present embodiment, a silicon substrate with (110) surface orientation is adopted, and the gate width direction (extending direction of a gate electrode) is set to the [111] direction of the silicon substrate.

Adopting such an orientation, after the steps of FIGS. 5A to 5C described in the second embodiment have been performed, first and second recesses 10a and 10b having depths of approximately 10 to 100 nm are formed in the silicon substrate 10 beside the gate electrode 14c by immersing the silicon substrate 10 in a TMAH solution having a volume concentration of 5 to 30% and a temperature of 0 to 50° C., thus obtaining a cross-sectional structure as shown in FIG. 14A.

In the case where the orientation of the silicon substrate 10 is (110) and the extending direction of the gate electrode 14c is the [111] direction as described above, a (111) plane which is exposed by etching in the TMAH solution is perpendicular to the surface of the silicon substrate 10. Accordingly, the side surfaces of the first and second recesses 10a and 10b, each of which is constituted of this (111) plane, are perpendicular to the surface of the silicon substrate 10.

FIG. 15 is a plan view after this step has been finished. The aforementioned FIG. 14A corresponds to a cross-sectional view taken along the I-I line of FIG. 15.

As shown in FIG. 15, the gate width direction, i.e. the extending direction of the gate electrode 14c, is the [111] direction, and the orientation of the silicon substrate 10 is (110). By adopting such an orientation, the side surfaces of the first and second recesses 10a and 10b can be made perpendicular to the surface of the silicon substrate 10.

Next, as shown in FIG. 14B, SiGe layers are selectively epitaxially grown in the recesses 10a and 10b by performing the aforementioned step of FIG. 5E, respectively. The SiGe layers are used as first and second source/drain material layers 18a and 18b.

Thereafter, the aforementioned steps of FIGS. 5F and 5G are performed, thereby completing the basic structure of a MOS transistor.

According to the present embodiment described above, the silicon substrate 10 with (110) orientation has been adopted, and the extending direction of the gate electrode 14c has been set to the [111] direction. Thus, etched surfaces of the silicon substrate 10 which have been etched in a TMAH solution or an organic alkaline solution become (111) planes in a direction perpendicular to the surface of the silicon substrate 10, and the first and second side surfaces 10c and 10d of the respective recesses 10a and 10b are constituted of the (111) planes. Accordingly, as represented by the arrows in FIG. 14B, uniform stress having a small variation in strength in the depth direction can be stably applied to the channel from the first and second source/drain material layers 18a and 18b in the recesses 10a and 10b.

(9) Ninth Embodiment

Figure 16:
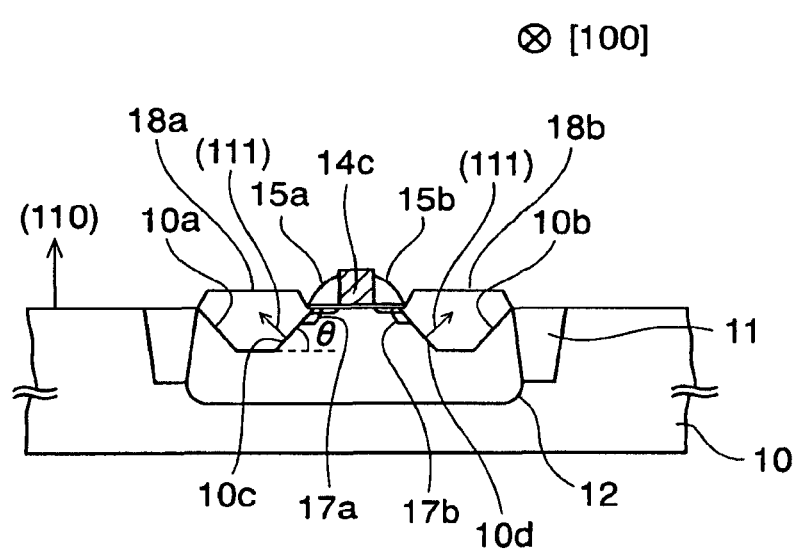
FIG. 16 is a cross-sectional view of a semiconductor device according to a ninth embodiment of the present invention in the process of manufacture.
Figure 17:
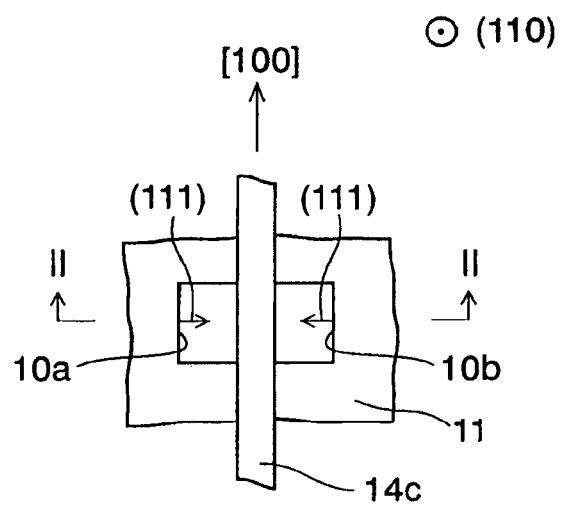
FIG. 17 is a plan view of the semiconductor device according to the ninth embodiment of the present invention in the process of manufacture.

FIG. 16 is a cross-sectional view of a semiconductor device according to a ninth embodiment of the present invention in the process of manufacture, and FIG. 17 is a plan view thereof. In these drawings, the components already described in the eighth embodiment are denoted by the same reference numerals and codes and will not be further described below.

In the eighth embodiment, the silicon substrate 10 with (110) orientation has been adopted, and the extending direction of the gate electrode 14c has been set to the [111] direction.

On the other hand, in the present embodiment, the orientation of a silicon substrate 10 is (110) similarly to the eighth embodiment, but the extending direction of the gate electrode 14c is set to the [100] direction.

In the case where such an orientation has been adopted and the steps of FIGS. 14A and 14B in the eighth embodiment have been performed, (111) planes constituting the first and second side surfaces 10c and 10d of the first and second recesses 10a and 10b come to have a tilt angle θ which is more gentle than that in the aforementioned second embodiment.

Thus, stress applied to the channel from the first and second source/drain material layers 18a and 18b steeply changes at positions closer to the surface layer than at positions deeper in the silicon substrate 10. Accordingly, a large stress can be applied to the channel, and the amount of the stress can be easily controlled.

Note that FIG. 17 is a plan view of this semiconductor device and that FIG. 16 corresponds to a cross-sectional view taken along the II-II line of FIG. 17.

(10) Tenth Embodiment

Next, a method of evaluating a semiconductor device according to a tenth embodiment of the present invention will be described.

In order to check whether a MOS transistor has characteristics as designed, a test transistor called a test element group (TEG) is fabricated in the development phase, and the carrier distribution in the channel of this transistor is actually physically measured. For the realization of this, it is necessary to expose the surface of a silicon substrate, which becomes a channel, to the outside by removing a gate electrode and a gate insulating film after the MOS transistor has been fabricated.

However, when the gate electrode and the gate insulating film are removed, if the silicon substrate is damaged, the carrier distribution in the channel is disturbed, and the obtained measurement value may deviate from the value in the transistor provided for actual use.

Accordingly, for an evaluation as described above, it is necessary to remove the gate electrode and the gate insulating film while preventing the silicon substrate from being damaged.

FIGS. 18A to 18E are cross-sectional views showing a method of fabricating a TEG used in a test method according to the present embodiment.

Figure 18A:
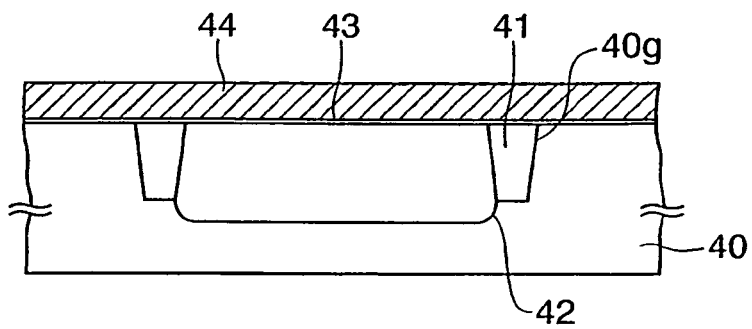
FIGS. 18A to 18E are cross-sectional views of a TEG to be used in a method of evaluating a semiconductor device according to a tenth embodiment of the present invention in the process of manufacture.

To begin with, steps to be performed before the cross-sectional structure shown in FIG. 18A is obtained will be described.

First, an element isolation trench 40g for shallow trench isolation (STI) is formed in a silicon substrate 40 with (001) surface orientation, and then a silicon dioxide layer is buried as an element isolation insulating film 41 in the element isolation trench 40g. Thereafter, an n-well 42 is formed in a p-type MOS transistor formation region delimited by the element isolation insulating film 41 by implanting phosphorus ions as n-type impurities into the silicon substrate 40 under the following conditions: the acceleration energy is approximately 300 keV or more, and the dose is $1\times10^{13}$ cm$^{-2}$ or more.

Subsequently, a gate insulating film 43 which is made of silicon dioxide and which has a thickness of approximately 0.5 to 10.0 nm is formed by thermally oxidizing the surface of the silicon substrate 40, and then a polysilicon layer 44 having a thickness of approximately 20 to 300 nm is formed on the gate insulating film 43 by LPCVD using silane. Here, a gate insulating film in which a very small amount of nitrogen is added to silicon dioxide may be adopted as the gate insulating film 43.

In the aforementioned second embodiment, in order to prevent the gate electrode from being etched in the TMAH solution, the p-type impurities having the effect of delaying the etch rate have been introduced into the polysilicon layer 14 (refer to FIG. 5A) constituting the gate electrode. However, in the present embodiment, since such a slow etch rate makes the removal of a gate electrode difficult, p-type impurities are not introduced into the polysilicon layer 44.

Figure 18B:
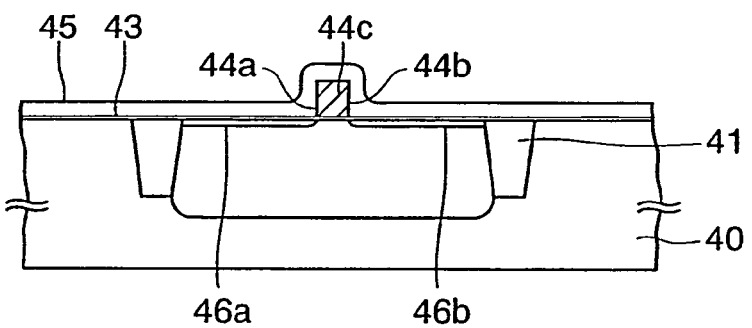

Next, steps to be performed before the cross-sectional structure shown in FIG. 18B is obtained will be described.

First, the polysilicon layer 44 is patterned into a gate electrode 44c by photolithography.

Subsequently, for example, boron ions are implanted as p-type impurities into the silicon substrate 40 using the gate electrode 44c as a mask, thus shallowly forming first and second source/drain extensions 46a and 46b in the silicon substrate 40 beside the first and second side surfaces 44a and 44b of the gate electrode 44c. As conditions for this ion implantation, the same ones for actual MOS transistors for commercial products are adopted. For example, conditions where the acceleration energy is approximately 0.2 to 1.0 keV and where the dose is approximately $1\times10^{14}$ to $5\times10^{15}$ cm$^{-2}$ are adopted. At the same time, pocket implantation of arsenic, phosphorus, antimony, or the like is performed as needed. Further, first and second source/drain extensions 46a and 46b using n-type impurities may be shallowly formed.

Thereafter, a silicon dioxide layer having a thickness of approximately 5 to 100 nm is formed as a sidewall insulating layer 45 on the entire surface by CVD using silane, thus covering the first and second side surfaces 44a and 44b of the gate electrode 44c with this sidewall insulating layer 45. Note that, instead of the silicon dioxide layer, a silicon nitride layer may be formed as the sidewall insulating layer 45.

Figure 18C:
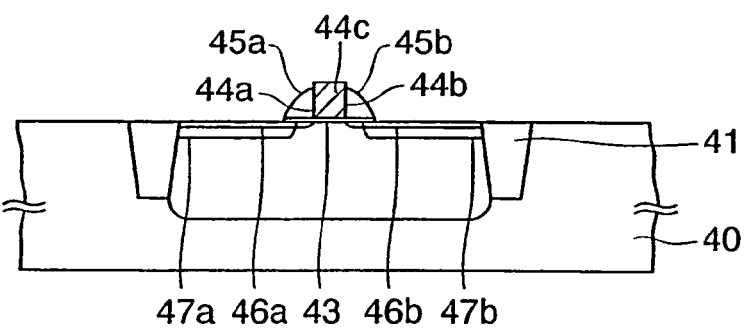

Next, steps to be performed before the cross-sectional structure shown in FIG. 18C is obtained will be described.

First, the sidewall insulating layer 45 is etched back by plasma etching to leave sidewalls 45a and 45b on the first and second side surfaces 44a and 44b. Further, in this etching, the portion of the gate insulating film 43 which is not covered with the sidewalls 45a and 45b is also etched, whereby the gate insulating film 43 is left only under the gate electrode 44c.

Furthermore, similar to the actual MOS transistor for commercial products, using the gate electrode 44c and the sidewalls 45a and 45b as a mask, for example, boron ions are implanted as p-type impurities into the silicon substrate 40 under the following conditions: the acceleration energy is approximately 1 to 10 keV, and the dose is approximately $5\times10^{14}$ to $1\times10^{16}$ cm$^{-2}$. Thus, source/drain regions 47a and 47b which are deeper and denser than the source/drain extensions 46a and 46b are formed in the silicon substrate 40 beside the gate electrode 44c. This impurity implantation may be omitted as needed.

Thereafter, the impurities in the source/drain regions 47a and 47b are activated by performing activation anneal under the following conditions: for example, the substrate temperature is approximately 950 to 1050° C., and the processing time is 0 to 10 seconds.

Figure 18D:
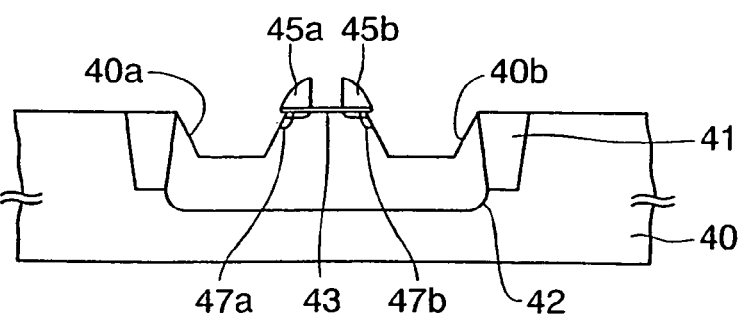

Next, steps to be performed before the cross-sectional structure shown in FIG. 18D is obtained will be described.

First, the silicon substrate 40 is immersed in a TMAH solution having a volume concentration of 5 to 30% and a temperature of 0 to 50° C., thereby etching the portion of the silicon substrate 40 and the portion of the gate electrode 44c, which are not covered with silicon dioxide. As in the experimental results shown in FIG. 2, a TMAH solution is very excellent in the etch selectivity between silicon and silicon dioxide. Accordingly, in this etching, the erosion of the gate insulating film 43 made of a silicon dioxide layer having a small film thickness is negligibly small, and the channel under the gate insulating film 43 is not damaged.

Further, by this etching, first and second recesses 40a and 40b are formed in the portion of the silicon substrate 40, which is not covered with the element isolation insulating film 41 and the sidewalls 45a and 45b.

Incidentally, this etching may be performed using an organic alkaline solution instead of the TMAH solution. In that case, damage to the channel is also small.

Figure 18E:
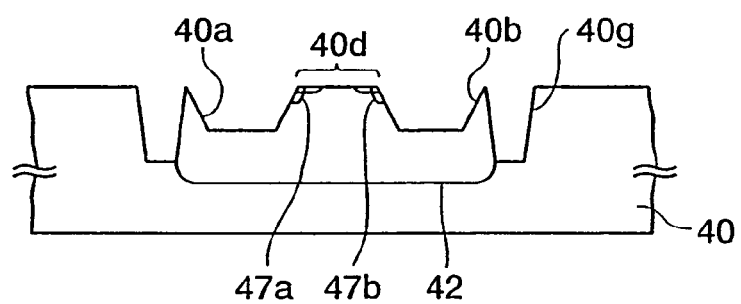

Thereafter, the silicon substrate 40 is immersed in an etchant made by mixing HF (hydrofluoric acid) and HCl at a volume ratio of 1:19, and the element isolation insulating film 41, the sidewalls 45a and 45b, and the gate insulating film 43, which are made of silicon dioxide, are thereby selectively removed. Thus the channel 40d of which carrier distribution is to be measured is exposed to the outside as shown in FIG. 18E. The channel 40d is terminated with hydrogen using hydrogen ions contained in the etchant, and is brought into a chemically active state.

Through the above-described steps, the basic structure of a TEG in which the channel 40d is exposed to the outside is completed.

Figure 19:
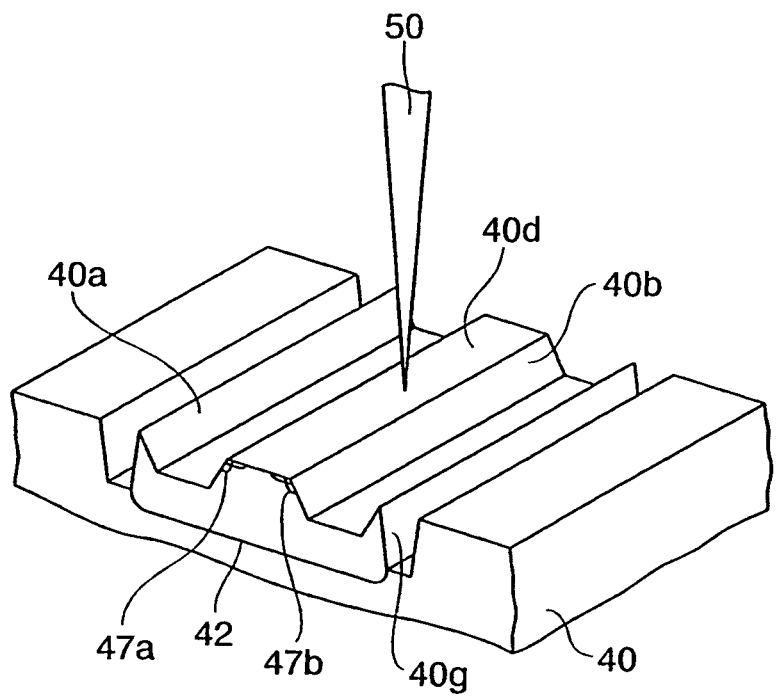
FIG. 19 is a perspective view for explaining the method of evaluating the semiconductor device according to the tenth embodiment of the present invention.

Next, a method of evaluating a carrier distribution in the channel 40d of this TEG will be described with reference to FIG. 19.

First, the TEG fabricated through the aforementioned steps is put into a scanning tunneling microscope (STM) which is a kind of probe microscope, and a probe 50 is moved in a plane parallel to the channel 40d with the tip of the probe 50 in a noncontact state. At this time, a predetermined voltage is applied between the probe 50 and the silicon substrate 40, and the value of the tunneling current flowing between the probe and the silicon substrate 40 changes depending on the carrier distribution in the channel 40d. The carrier distribution in the channel 40d can be grasped by visualizing the change in the tunneling current.

According to the present embodiment described above, the gate electrode 44c is selectively etched using the TMAH solution or an organic alkaline solution as shown in FIG. 18D, and thereafter the gate insulating film 43 is etched and removed using the etchant made by mixing HF and HCl, thus exposing the channel 40d as shown in FIG. 18E.

Thus, use of a TMAH solution or an organic alkaline solution, which is excellent in the selectivity between silicon and silicon dioxide makes it possible to remove only the gate electrode 44c at a high etch selectivity without damaging the channel region 44d under the gate electrode 44c. Accordingly, in the process of exposing the channel 40d, there is no fear that the carrier distribution in the channel may fluctuate, and almost the same carrier distribution as that in the MOS transistor provided for actual use can be measured, thus making it possible to accurately evaluate the performance of the MOS transistor.

Furthermore, according to the present embodiment, since the gate insulating film 43 is etched and removed using an etchant containing HF, the surface of the channel 40d which is exposed after the gate insulating film 43 has been removed is automatically terminated with hydrogen. In the measurement of the carrier distribution using an STM, it is preferable that a surface to be measured is terminated with hydrogen in order to clearly observe the change in conductivity in the surface to be measured. According to the above, since hydrogen termination can be performed simultaneously with the removal of the gate insulating film 43, there is no need for a step for hydrogen termination, and the carrier distribution can be easily measured.

Figure 20A:
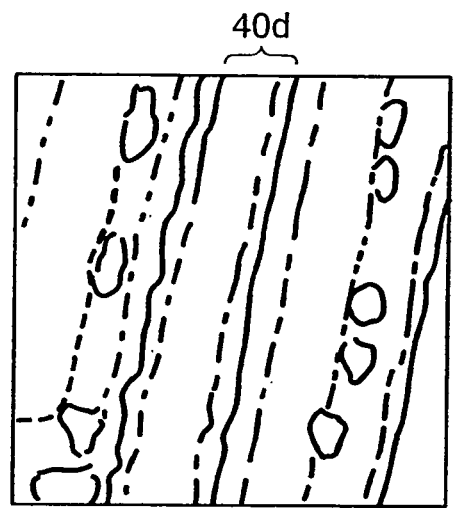
FIGS. 20A and 20B are views drawn based on a relief image obtained by actually measuring the TEG used in the tenth embodiment of the present invention, using a scanning tunneling microscope.
Figure 20B:
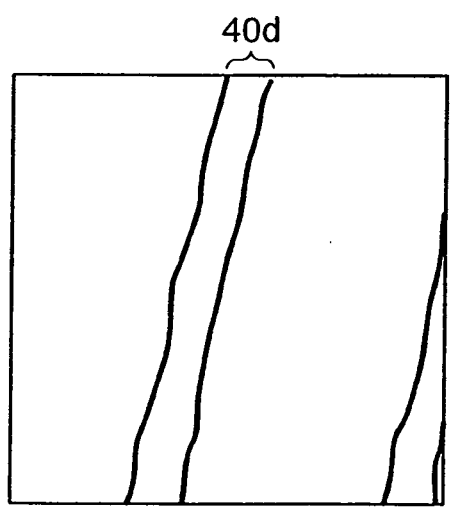

FIGS. 20A and 20B are views drawn based on a relief image after the surface of the TEG of the present embodiment has been actually scanned using an STM. FIG. 20B is a view in which the brightness in the image of FIG. 20A is enhanced.

Figure 21:
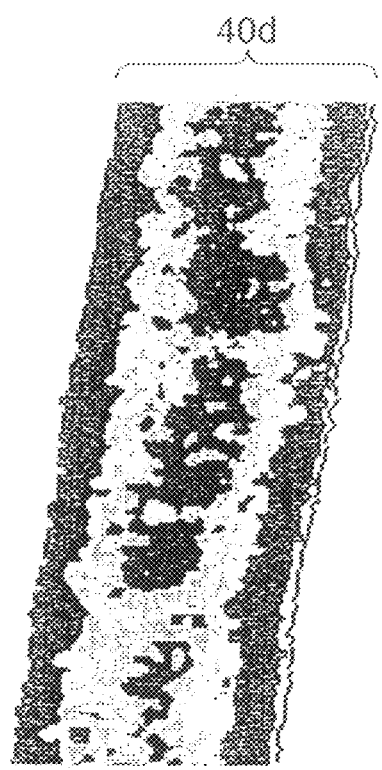
FIG. 21 is a view obtained by actually measuring the carrier distribution in the TEG used in the tenth embodiment of the present invention.

Further, FIG. 21 is an image obtained by observing the carrier distribution in the channel 40d of the TEG of FIGS. 20A and 20B using an STM.

As described previously, in the present embodiment, the channel is less prone to being damaged when the gate electrode 44c is etched and removed. The carrier distribution shown in FIG. 21 is expected to be almost the same distribution as that in the MOS transistor provided for actual use.

In the present embodiment as described above, it may also be considered that plasma etching is adopted for the removal of the gate electrode 44c. However, in plasma etching, as the etching proceeds, more damage occurs in the channel 40d through the gate insulating film 43 due to the kinetic energy of ions in an etching atmosphere. Accordingly, the carrier distribution fluctuates, and the performance of the MOS transistor cannot be accurately evaluated, unlike the present embodiment.

Moreover, the MOS transistor to be evaluated in the present embodiment is not limited to a type in which stress is applied to the channel by forming source/drain material layers, such as SiGe layers, in the first and second recesses 40a and 40b. For example, a MOS transistor of a general type in which recesses do not exist in actual use can be an object of evaluation. However, in a TEG for a MOS transistor of this type, the portion of the silicon substrate 40 having no element isolation insulating film 41 therein is also etched when the gate electrode 44c is etched in the step of FIG. 18D. Accordingly, the recesses 40a and 40b are formed in these portions.

(11) Eleventh Embodiment

Next, a method of evaluating a semiconductor device according to an eleventh embodiment of the present invention will be described.

Figure 22:
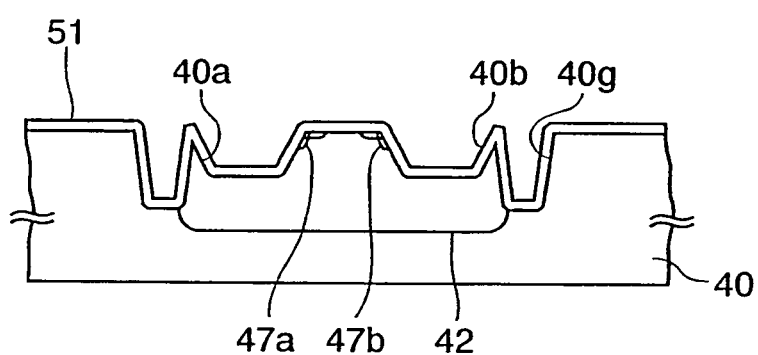
FIG. 22 is a cross-sectional view of a TEG used in a method of evaluating a semiconductor device according to an eleventh embodiment of the present invention.

FIG. 22 is a cross-sectional view of a TEG used in the present embodiment.

In the tenth embodiment, the channel 40d has been observed using an STM, which is a kind of probe microscope. On the other hand, in the present embodiment, the channel 40d is observed using a scanning capacitance microscope.

In the scanning capacitance microscopy, a probe of the microscope and the channel 40d constitute a capacitor, and the capacitance value of the capacitor is detected, whereby an impurity distribution in the channel 40d is observed. In the present embodiment, in order to form a dielectric layer of the capacitor, a silicon dioxide layer (dielectric layer) 51 having a thickness of approximately 1.0 nm as shown in FIG. 22 is formed on the surface of the silicon substrate 40 by applying ozone to the surface of the channel 40*d*.

Figure 23:
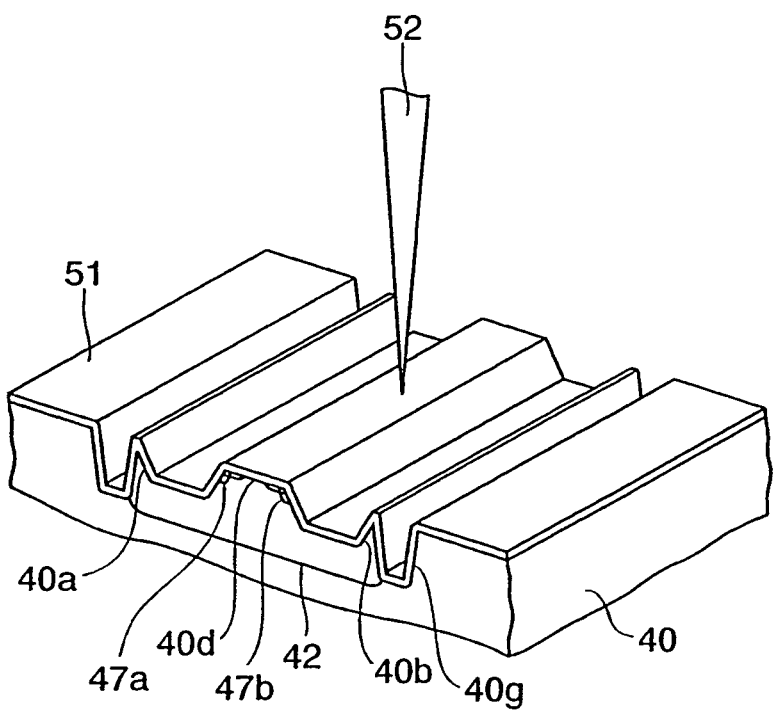
FIG. 23 is a perspective view for explaining the method of evaluating the semiconductor device according to the eleventh embodiment of the present invention.

Thereafter, as shown in FIG. 23, the silicon dioxide layer 51 is scanned by the probe 52 with the tip of the probe 52 of the scanning capacitance microscope brought into contact with the surface of the silicon dioxide layer 51, thereby obtaining the carrier distribution in the channel 40*d* through the silicon dioxide layer 51.

In the case where the channel 40*d* is observed using a scanning capacitance microscope as described above, the removal of the gate electrode 44*c* by wet etching using a TMAH solution similarly to the tenth embodiment makes it possible to prevent damage to the silicon substrate 40 and to measure almost the same carrier distribution as that in the MOS transistor provided for actual use.

Note that, though a scanning capacitance microscope has been used in the above, use of a scanning spreading resistance microscope instead can also provide the same advantages as those of the present embodiment.

In the semiconductor device according to the present invention, a crystal plane of a semiconductor substrate constitutes a side surface of each of holes in which source/drain material layers are respectively formed. Accordingly, stress applied to a channel from the source/drain material layers can be prevented from varying among elements, and the reliability of the semiconductor device can be improved.

Moreover, in the method of manufacturing a semiconductor device according to the present invention, holes are formed in a silicon substrate beside the gate electrode by wet etching using an organic alkaline solution or a TMAH solution as an etchant. Accordingly, a crystal plane of the semiconductor substrate is exposed at each etched surface, and the crystal plane constitutes a side surface of each hole. Thus, excellent reproducibility comes to be shown, and stress is applied to the channel from the source/drain material layers, which are formed in the holes, without variation among elements even in the case where MOS transistors are integrally formed in the semiconductor substrate.

Furthermore, in the method of evaluating a semiconductor device according to the present invention, since a gate electrode is removed by etching using an organic alkaline solution or a TMAH solution, damage does not easily occur in a channel in etching, and a carrier distribution in the channel is not easily disturbed. Accordingly, a carrier distribution in a state similar to that of actual use can be obtained.

What is claimed is:

1. A semiconductor device comprising:
a semiconductor substrate which is a silicon substrate;
a gate insulating film formed on the semiconductor substrate;
a gate electrode formed on the gate insulating film;
a SiGe layer formed in a hole in the semiconductor substrate; and
a sidewall formed on the side of the gate electrode,
wherein a first side surface of the hole is located under the sidewall,
the first side surface includes two crystal planes,
a cross-sectional shape of the first side surface is concave,
each of the two crystal planes of the first side surface is defined by a (111) plane of the silicon substrate, and
the SiGe layer is located under the sidewall and is not located under the gate electrode.

2. The semiconductor device according to claim 1, wherein a gate width direction of the gate electrode is a [100] direction of the silicon substrate.

3. The semiconductor device according to claim 1, wherein the entire gate electrode is made of silicide of refractory metal.

4. The semiconductor device according to claim 1, wherein one of the two crystal planes is connected to the surface of the semiconductor substrate, and another of the two crystal planes is connected to a bottom surface of the hole.

5. The semiconductor device according to claim 1 further comprising:
a channel region in the silicon substrate under the gate electrode; and
a source/drain region located between the (111) plane of the silicon substrate and the channel region.

6. The semiconductor device according to claim 1, further comprising:
an insulating film formed over the SiGe layer; and
a conductive plug formed in the insulating film and electrically connected to the SiGe layer,
wherein an upper surface of the SiGe layer is located higher than an interface between the silicon substrate and the gate insulating film.

7. The semiconductor device according to claim 6, further comprising:
a silicide layer formed between the SiGe layer and the conductive plug,
wherein a bottom surface of the silicide layer is located higher than an interface between the silicon substrate and the gate insulating film.

8. The semiconductor device according to claim 7, wherein the silicide layer includes Pt.

9. The semiconductor device according to claim 1, further comprising
a silicide layer formed over the SiGe layer,
wherein a second side surface of the hole that faces the first side surface is composed of the silicon substrate.

10. The semiconductor device according to claim 9, wherein
the second side surface includes two crystal planes, and
each of the two crystal planes of the second side surface is defined by a (111) plane of silicon.

11. The semiconductor device according to claim 10, wherein the silicide layer includes Pt.

12. A semiconductor device comprising:
a semiconductor substrate which is a silicon substrate;
a gate insulating film formed on the semiconductor substrate;
a gate electrode formed on the gate insulating film;
a sidewall formed on the side of the gate electrode; and
a SiGe layer formed in a hole in the semiconductor substrate,
wherein the hole includes a first side surface that is located under the sidewall and a bottom surface, and
a first angle between the bottom surface of the hole and the first side surface is more gentle than a second angle between a (100) plane of the silicon substrate and a (111) plane of the silicon substrate.

13. The semiconductor device according to claim 12, wherein
the hole includes a second side surface that faces the first side surface, and
the second side surface is composed of the silicon substrate.

14. The semiconductor device according to claim 13, wherein a third angle between the bottom surface of the hole and the second side surface is more gentle than the second angle.

15. The semiconductor device according to claim 12, wherein a gate width direction of the gate electrode is a [100] direction of the silicon substrate.

16. The semiconductor device according to claim 12, wherein the SiGe layer is located under the sidewall and is not located under the gate electrode.

17. The semiconductor device according to claim 12, further comprising
    an insulating film formed over the SiGe layer; and
    a conductive plug formed in the insulating film and electrically connected to the SiGe layer,
    wherein an upper surface of the SiGe layer is located higher than an interface between the silicon substrate and the gate insulating film.

18. The semiconductor device according to claim 17, further comprising:
    a silicide layer formed between the SiGe layer and the conductive plug,
    wherein a bottom surface of the silicide layer is located higher than an interface between the silicon substrate and the gate insulating film.

19. The semiconductor device according to claim 18, wherein the silicide layer includes Pt.

* * * * *